(12) United States Patent
Shen et al.

(10) Patent No.: US 12,363,951 B2
(45) Date of Patent: Jul. 15, 2025

(54) SEMICONDUCTOR STRUCTURE AND METHOD FOR FABRICATING SEMICONDUCTOR STRUCTURE

(71) Applicant: CHANGXIN MEMORY TECHNOLOGIES, INC., Hefei (CN)

(72) Inventors: Yutong Shen, Hefei (CN); Jifeng Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 468 days.

(21) Appl. No.: 17/845,971

(22) Filed: Jun. 21, 2022

(65) Prior Publication Data

US 2023/0282752 A1 Sep. 7, 2023

Related U.S. Application Data

(63) Continuation of application No. PCT/CN2022/087965, filed on Apr. 20, 2022.

(30) Foreign Application Priority Data

Mar. 2, 2022 (CN) .......................... 202210199966.7

(51) Int. Cl.
 *H10D 30/67* (2025.01)
 *H10D 30/01* (2025.01)
(52) U.S. Cl.
 CPC ....... *H10D 30/6755* (2025.01); *H10D 30/031* (2025.01)

(58) Field of Classification Search
 CPC .............. H10D 30/6755; H10D 30/031; H01L 29/78648; H10B 12/488
 See application file for complete search history.

(56) References Cited

U.S. PATENT DOCUMENTS 6,100,569 A 8/2000 Moronuki
2007/0099125 A1* 5/2007 Chen ................. H01L 21/76885
257/E21.507

(Continued)

FOREIGN PATENT DOCUMENTS

CN 1469434 A 1/2004
CN 112103332 A 12/2020
CN 113140624 A 7/2021

*Primary Examiner* — Thanh T Nguyen
(74) *Attorney, Agent, or Firm* — Kilpatrick Townsend & Stockton LLP

(57) ABSTRACT

Embodiments provide a semiconductor structure and a method for fabricating the same. The semiconductor structure includes: a substrate, having a first region and a second region; a first gate structure positioned in the first region and a second gate structure positioned in the second region, the first gate structure being a high dielectric constant gate including a first gate electrode layer and a high dielectric constant layer, and the second gate structure including a second gate electrode layer and an oxide insulating layer; a spacer and an interlayer dielectric layer, positioned on the first gate structure and the second gate structure, the spacer and the interlayer dielectric layer covering a part of the second gate structure, the substrate, and the first gate structure; and a second contact plug, penetrating through the spacer and the interlayer dielectric layer and being in contact with the substrate.

20 Claims, 14 Drawing Sheets

(56) References Cited

U.S. PATENT DOCUMENTS

| | | |
|---|---|---|
| 2008/0099851 A1 | 5/2008 | Hsu et al. |
| 2013/0119469 A1* | 5/2013 | Iwamatsu ............ H10B 10/125 |
| | | 257/E27.06 |
| 2015/0228754 A1* | 8/2015 | Sung ................... H10D 84/038 |
| | | 438/595 |

* cited by examiner

SEMICONDUCTOR STRUCTURE AND METHOD FOR FABRICATING SEMICONDUCTOR STRUCTURE

CROSS-REFERENCE TO RELATED APPLICATION

The present disclosure is a continuation of PCT/CN2022/087965, filed on Apr. 20, 2022, which claims priority to Chinese Patent Application No. 202210199966.7 titled "SEMICONDUCTOR STRUCTURE AND METHOD FOR FABRICATING SEMICONDUCTOR STRUCTURE" and filed on Mar. 2, 2022, the entire contents of which are incorporated herein by reference.

TECHNICAL FIELD

The present disclosure relates to the field of semiconductor technology, and more particularly, to a semiconductor structure and a method for fabricating a semiconductor structure.

BACKGROUND

In a pattern design of a core region of Dynamic Random Access Memory (DRAM) such as the layout design of an HKMG (high-k insulating layer+gate electrode layer) structure, there exists a design where an active area (AA) and a gate share a common contact structure, and the gate used as lead in this design. However, during an etching process of the contact structure, a spacer on a sidewall of a protect gate (PG) may be partially etched, thereby exposing a gate material of the protect gate, such that an HK layer metal such as lanthanum oxide (LaO) or aluminum oxide (ALO) may cause pollution to machine environment. Moreover, when the HK layer metal falls on the active area, pollution of silicon may be caused. In addition, after a contact plug is formed by filling the metal, because the spacer on the sidewall of the protect gate is partially etched and due to the property of easy diffusion of lanthanum and aluminum, these metal materials will diffuse into the contact plug, which may pollute the contact plug.

SUMMARY

In one aspect of the present disclosure, there is provided a semiconductor structure, which includes: a substrate, having a first region and a second region; a first gate structure positioned in the first region and a second gate structure positioned in the second region, the first gate structure being a high dielectric constant gate including a first gate electrode layer and a high dielectric constant layer, and the second gate structure including a second gate electrode layer and an oxide insulating layer; a spacer and an interlayer dielectric layer, positioned on the first gate structure and the second gate structure, the spacer and the interlayer dielectric layer covering a part of the second gate structure, the substrate, and the first gate structure; and a second contact plug, penetrating through the spacer and the interlayer dielectric layer and being in contact with the substrate, the second contact plug being positioned in the second region and being lapped with the second gate structure.

According to one embodiment of the present disclosure, the high dielectric constant layer includes: a high dielectric constant insulating layer arranged on a surface of the substrate; and a high dielectric constant metal layer arranged on the high dielectric constant insulating layer. The first gate electrode layer is arranged on the high dielectric constant metal layer. A first dielectric material layer is arranged between the high dielectric constant insulating layer and the high dielectric constant metal layer, and another first dielectric material layer is arranged between the high dielectric constant metal layer and the first gate electrode layer.

According to one embodiment of the present disclosure, the high dielectric constant metal layer includes an aluminum oxide metal layer, a second dielectric material layer and a lanthanum oxide metal layer from bottom to top; and/or the first gate electrode layer includes a polysilicon layer, a first barrier layer and a metal layer from bottom to top.

According to one embodiment of the present disclosure, the semiconductor structure further includes: a first contact plug, penetrating through the spacer and the interlayer dielectric layer and being in contact with the substrate, where the first contact plug is spaced apart from the first gate structure.

According to one embodiment of the present disclosure, the oxide insulating layer covers the substrate, the first gate structure is arranged on the oxide insulating layer, the spacer and the interlayer dielectric layer cover the oxide insulating layer, and the first contact plug and the second contact plug penetrate through the oxide insulating layer, the spacer, and the interlayer dielectric layer.

According to one embodiment of the present disclosure, the first contact plug includes a first contact layer in contact with the substrate; and/or the second contact plug includes a second contact layer in contact with the substrate.

According to one embodiment of the present disclosure, the second gate structure includes a second gate electrode layer comprising a polysilicon layer, a second barrier layer and a metal layer from bottom to top.

According to one embodiment of the present disclosure, the second contact plug is lapped with a first part of top surface of the second gate structure and a first side surface adjacent to the first part of top surface, and a projection of the second contact plug on the substrate is partially overlapped with a projection of the second gate structure on the substrate.

According to one embodiment of the present disclosure, the second gate structure further includes another spacer positioned between the second gate electrode layer and the oxide insulating layer.

According to one embodiment of the present disclosure, the first region and the second region are positioned in a peripheral circuit region of the semiconductor structure.

Another aspect of the present disclosure provides a method for fabricating a semiconductor structure. The method includes: providing a substrate having a first region and a second region, forming a first gate structure on the first region of the substrate and forming a second gate structure on the second region of the substrate, where the first gate structure is a high dielectric constant gate including a first gate electrode layer and a high dielectric constant layer, and the second gate structure includes a second gate electrode layer and an oxide insulating layer; forming a spacer and an interlayer dielectric layer on a surface of the substrate, where the spacer and the interlayer dielectric layer cover the substrate, the first gate structure, and the second gate structure; removing a part of the second gate structure, a part of the spacer and a part of the interlayer dielectric layer to form a second contact hole; and filling a conductive material into the second contact hole to form a second contact plug partially lapped with the second gate structure.

According to one embodiment of the present disclosure, the step of forming a first gate structure on the first region of the substrate and forming a second gate structure on the second region of the substrate includes: forming a thin-film stacked structure on the substrate, where the thin-film stacked structure includes an oxide insulating layer and a high dielectric constant layer from bottom to top; forming a first gate material layer on the thin-film stacked structure; removing a part of the first gate material layer and a part of the thin-film stacked structure by etching to form the first gate structure, and stopping etching upon exposing an upper surface of the oxide insulating layer; forming a second gate material layer on the oxide insulating layer, where the second gate material layer covers the first gate structure; and removing a part of the second gate material layer by etching, where rest of the second gate material layer and the oxide insulating layer jointly constitute the second gate structure.

According to one embodiment of the present disclosure, the step of removing a part of the first gate material layer and a part of the thin-film stacked structure by etching includes: depositing a first photoresist layer on the first gate material layer; patterning the first photoresist layer; removing a part of the first gate material layer and a part of the thin-film stacked structure by etching by means of the patterned first photoresist layer to form the first gate structure.

According to one embodiment of the present disclosure, before the step of forming a second gate material layer on the oxide insulating layer, the method further includes: forming a mask layer on a surface of the first gate structure and on a surface of the oxide insulating layer.

According to one embodiment of the present disclosure, the step of removing a part of the second gate material layer by etching includes: depositing a second photoresist layer on the second gate material layer; patterning the second photoresist layer; and removing a part of the second gate material layer by etching by means of the patterned second photoresist layer to form the second gate structure.

According to one embodiment of the present disclosure, the step of forming a first gate structure on the first region of the substrate and forming a second gate structure on the second region of the substrate includes: forming a thin-film stacked structure on the substrate, where the thin-film stacked structure includes an oxide insulating layer and a high dielectric constant layer from bottom to top; removing the thin-film stacked structure positioned in the second region by etching, and stopping etching upon exposing an upper surface of the oxide insulating layer; forming a first gate material layer covering rest of the thin-film stacked structure, and forming a second gate material layer covering the oxide insulating layer in the second region; and removing a part of the first gate material layer and a part of the thin-film stacked structure by etching to form the first gate structure, stopping etching upon exposing the upper surface of the oxide insulating layer, and removing a part of the second gate material layer by etching, where rest of the second gate material layer and the oxide insulating layer jointly constitute the second gate structure.

According to one embodiment of the present disclosure, the step of removing the thin-film stacked structure positioned in the second region by etching includes: depositing a third photoresist layer on the thin-film stacked structure; patterning the third photoresist layer; and removing the thin-film stacked structure in the second region by etching by means of the patterned third photoresist layer.

According to one embodiment of the present disclosure, the first gate material layer and the second gate material layer have a same material, and the step of removing a part of the first gate material layer and a part of the thin-film stacked structure and removing a part of the second gate material layer by etching includes: depositing a fourth photoresist layer on the first gate material layer and the second gate material layer; patterning the fourth photoresist layer; and removing a part of the first gate material layer and a part of the thin-film stacked structure and simultaneously removing a part of the second gate material layer by etching by means of the patterned fourth photoresist layer, to form the first gate structure and the second gate structure, respectively.

According to one embodiment of the present disclosure, the method for fabricating a semiconductor structure further includes: forming a first contact hole in the spacer and the interlayer dielectric layer positioned in the first region, where the first contact hole is spaced apart from the first gate structure; and filling a conductive material into the first contact hole to form a first contact plug in contact with the substrate.

According to one embodiment of the present disclosure, the step of filling a conductive material into the first contact hole and filling the conductive material into the second contact hole includes: forming the conductive material covering the interlayer dielectric layer, where the conductive material is filled into the first contact hole and the second contact hole; polishing to remove the conductive material covered on an upper surface of the interlayer dielectric layer; and/or before the step of filling a conductive material into the first contact hole and filling the conductive material into the second contact hole, the method further includes: forming a first contact layer in contact with the substrate at a bottom of the first contact hole, and forming a second contact layer in contact with the substrate at a bottom of the second contact hole.

DETAILED DESCRIPTION

Exemplary embodiments will now be described more fully with reference to the accompanying drawings. However, the exemplary embodiments can be implemented in a variety of forms and should not be construed as being limited to the embodiments set forth herein. Rather, these embodiments are provided such that the present disclosure will be thorough and complete and will fully convey the concepts of exemplary embodiments to those skilled in the art. Throughout the drawings, similar reference signs indicate the same or similar structures, and thus their detailed descriptions are omitted.

Figure 1:
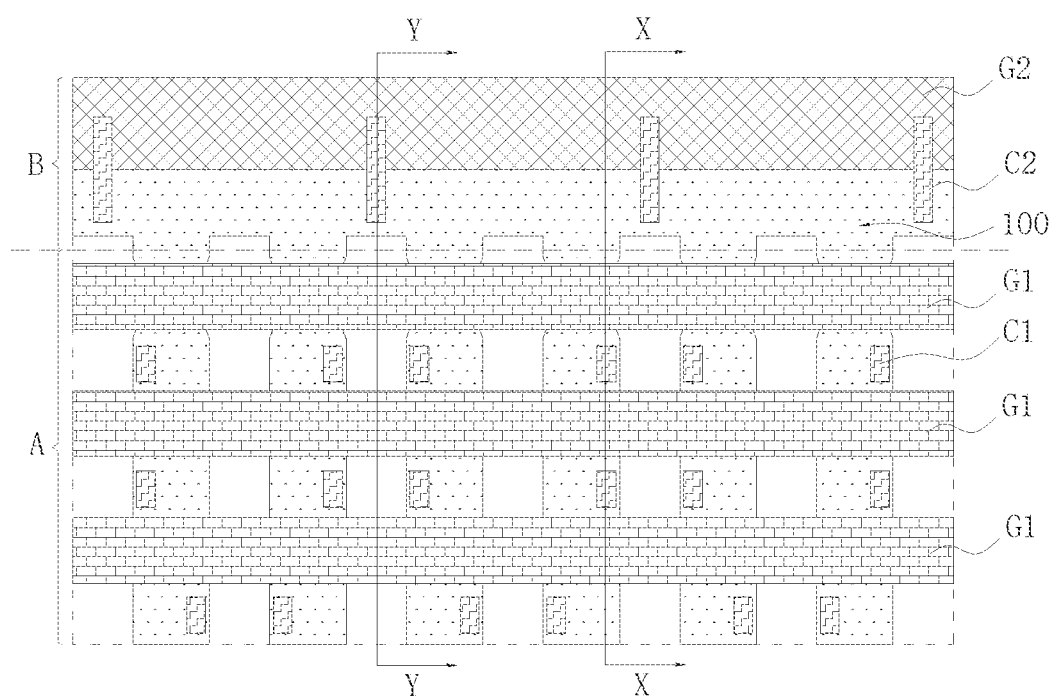
FIG. 1 is a schematic plan diagram of a partial structure of a semiconductor structure according to the present disclosure.

Referring to FIG. 1, a schematic plan diagram (i.e., top view) of a partial structure of a semiconductor structure proposed by the present disclosure is typically shown. In this exemplary embodiment, the semiconductor structure proposed by the present disclosure is illustrated by taking a dynamic random access memory (DRAM) as an example. It is readily comprehensible to those skilled in the art that to apply relevant design of the present disclosure to other types of semiconductor structures, various modifications, additions, substitutions, deletions or other variations are made to the following embodiments, and these variations still fall within the scope of the principle of the semiconductor structure proposed in the present disclosure.

It should be noted that FIG. 1 only shows the partial structure of the semiconductor structure proposed in the present disclosure, which typically includes a substrate 100, a first gate structure G1, a second gate structure G2, and a second contact plug C2. In other drawings showing process steps, FIG. 9, FIG. 11, FIG. 13, FIG. 22, FIG. 24 and FIG. 26 may be respectively understood as schematic cross section views along a straight line X-X in FIG. 1, and FIG. 10, FIG. 12, FIG. 14, FIG. 23, FIG. 25 and FIG. 27 may be respectively understood as schematic cross section views along a straight line Y-Y in FIG. 1. In addition, because processes embodied in the other drawings show an approximately identical semiconductor morphology in the "X-X" cross section view and the "Y-Y" cross section view, the above distinction is not made.

As shown in FIG. 1, with reference to FIG. 13, FIG. 14, FIG. 26 and FIG. 27, in one embodiment of the present disclosure, the semiconductor structure proposed by the present disclosure includes a substrate 100, a first gate structure G1 and a second gate structure G2, a spacer 600 and an interlayer dielectric layer 700, and a second contact plug C2. The substrate 100 has a first region A and a second region B. The first gate structure G1 is arranged on the first region A of the substrate 100, and the second gate structure G2 is arranged on the second region B of the substrate 100. The first gate structure G1 is a high dielectric constant gate including a first gate electrode layer and a high dielectric constant layer, and the second gate structure G2 includes a second gate electrode layer and an oxide insulating layer. The spacer 600 and the interlayer dielectric layer 700 are positioned on the first gate structure G1 and the second gate structure G2, and cover a part of the second gate structure G2, the substrate 100 and the first gate structure G1, respectively. The second contact plug C2 penetrates through the interlayer dielectric layer 700 and the spacer 600, a bottom of the second contact plug C2 is in contact with the substrate 100, and the second contact plug C2 is positioned in the second region B and is lapped with the second gate structure G2. Through the above design, the present disclosure adopts a gate structure comprising a gate electrode layer and an oxide insulating layer, such that a problem of metal diffusion pollution of an HK layer in the existing solution can be avoided while reducing a connection area of metal on an upper layer, thereby protecting device performance from effect of pollution.

Figure 13:
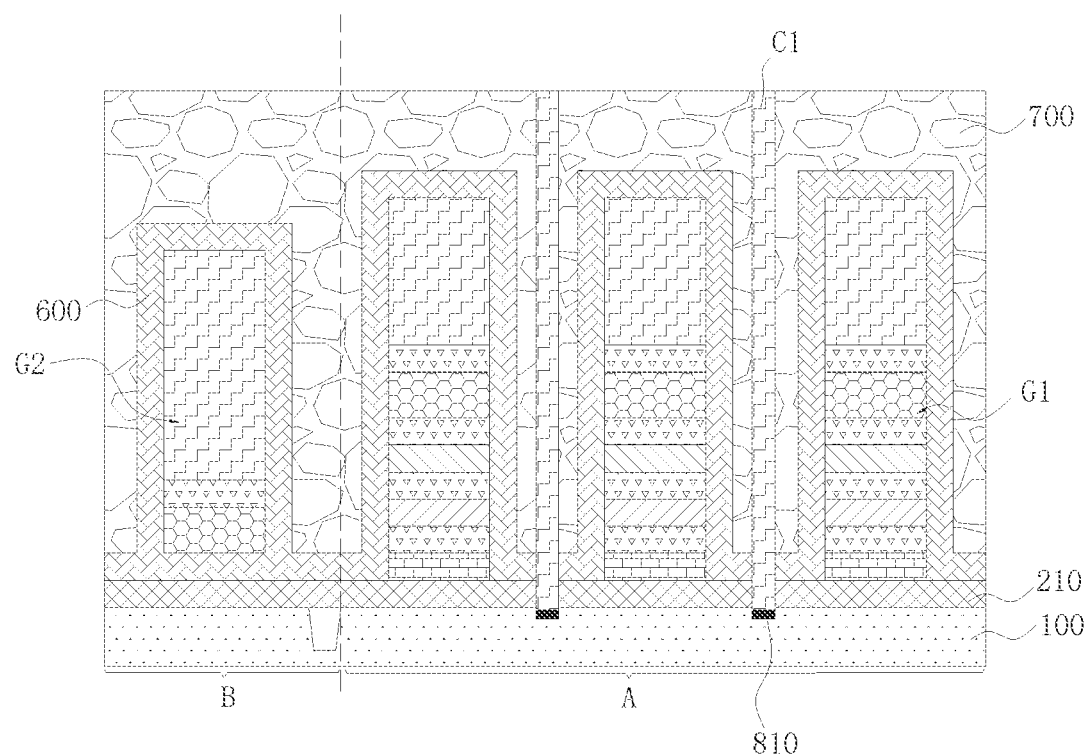
Figure 26:
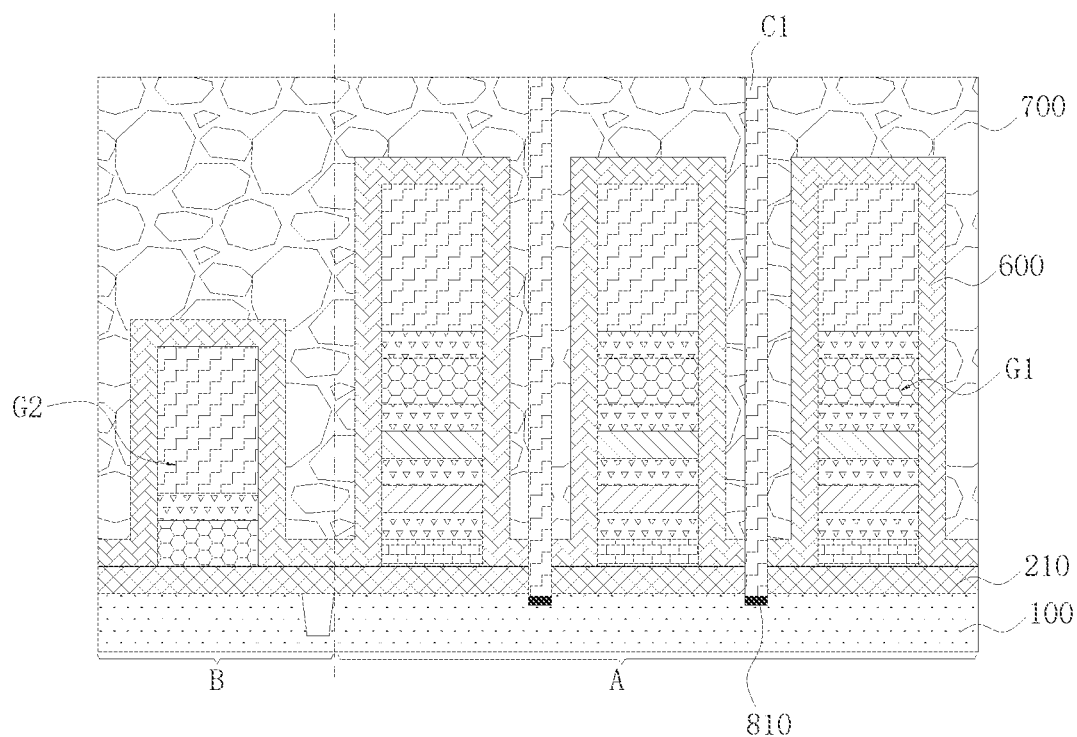

As shown in FIG. 1, FIG. 13 and FIG. 26, in an embodiment of the present disclosure, the semiconductor structure proposed by the present disclosure further includes a first contact plug C1, where the first contact plug C1 penetrates through the interlayer dielectric layer 700 and the spacer 600, a bottom of the first contact plug C1 is in contact with the substrate 100, and the first contact plug C1 is spaced apart from the first gate structure G1.

In an embodiment of the present disclosure, a first contact hole V1 is formed in the interlayer dielectric layer 700 of the first region A, and is spaced apart from the first gate structure G1. The second contact hole V2 is formed by removing a part of the second gate structure G2, a part of the spacer 600, and the interlayer dielectric layer 700. The first contact plug C1 is arranged in the first contact hole V1. The second contact plug C2 is arranged in the second contact hole V2.

As shown in FIG. 13, FIG. 14, FIG. 26 and FIG. 27, in an embodiment of the present disclosure, the first gate structure G1 includes a high dielectric constant layer and a first gate electrode layer. The high dielectric constant layer includes a high dielectric constant insulating layer 220 and a high dielectric constant metal layer, where the high dielectric constant insulating layer 220 is arranged on a surface of the substrate 100, and the high dielectric constant metal layer is arranged on a surface of the high dielectric constant insulating layer 220. The first gate electrode layer is arranged on the high dielectric constant metal layer. A first dielectric material layer 250 is respectively arranged between the high dielectric constant insulating layer 220 and the high dielectric constant metal layer, between the high dielectric constant insulating layer 220 and the first gate electrode layer, and between the high dielectric constant metal layer and the first gate electrode layer (referring to FIG. 4).

In an embodiment of the present disclosure, a material of the first dielectric material layer 250 may be titanium nitride (TiN).

As shown in FIG. 13, FIG. 14, FIG. 26 and FIG. 27, based on the design where the first gate structure G1 includes a high dielectric constant layer and the high dielectric constant layer includes a high dielectric constant metal layer, in an embodiment of the present disclosure, the high dielectric constant metal layer includes an aluminum oxide metal layer 230, a second dielectric material layer 260 (referring to FIG. 3) and a lanthanum oxide metal layer 240 from bottom to top.

In an embodiment of the present disclosure, a material of the second dielectric material layer 260 may be titanium nitride.

As shown in FIG. 13, FIG. 14, FIG. 26 and FIG. 27, based on the design where the first gate structure G1 includes a first gate electrode layer, in an embodiment of the present disclosure, reference may be made to rest of the first gate material layer 300 shown in the accompanying drawings for the first gate electrode layer, where the first gate material layer 300 includes a polysilicon layer 310, a first barrier layer 330 (referring to FIG. 3) and a metal layer 320 from bottom to top.

In an embodiment of the present disclosure, a material of the first barrier layer 330 may be titanium nitride.

As shown in FIG. 13, FIG. 14, FIG. 26 and FIG. 27, in an embodiment of the present disclosure, an oxide insulating layer 210 covers the surface of the substrate 100. On this basis, the first gate structure G1 and the second gate structure G2 are respectively arranged on the oxide insulating layer 210, the spacer 600 covers the oxide insulating layer 210, the first gate structure G1 and the second gate structure G2, the first contact plug C1 and the second contact plug C2 penetrate through the spacer 600, the interlayer dielectric layer 700, and the oxide insulating layer 210.

As shown in FIG. 13, FIG. 14, FIG. 26 and FIG. 27, based on the design where the semiconductor structure includes the oxide insulating layer 210, in one embodiment of the present disclosure, the second gate structure G2 may include a second gate electrode layer and the oxide insulating layer 210 below the second gate electrode layer, and reference may be made to rest of the second gate material layer 400 shown in the accompanying drawings for the second gate electrode layer, where the second gate material layer 400 includes a polysilicon layer, a second barrier layer and a metal layer from bottom to top. Hereby, in the present disclosure, the second gate electrode layer is arranged on the oxide insulating layer 210, and the oxide insulating layer 210 below the second gate electrode layer is used as a part of the second gate structure G2, to realize the design "the gate structure comprising a gate electrode layer and an oxide insulating layer" for the second gate structure G2 in the second region B.

As shown in FIG. 13, FIG. 14, FIG. 26 and FIG. 27, in an embodiment of the present disclosure, the second contact plug C2 is lapped with a first part of top surface of the second gate structure G2 and a first side surface adjacent to the first part of top surface. On this basis, a projection of the second contact plug C2 on the substrate 100 is partially overlapped with a projection of the second gate structure G2 on the substrate 100.

As shown in FIG. 13, FIG. 14, FIG. 26 and FIG. 27, in an embodiment of the present disclosure, a first contact layer 810 is provided between the first contact plug C1 and the substrate 100, and a second contact layer 820 is provided between the second contact plug C2 and the substrate 100.

Figure 14:
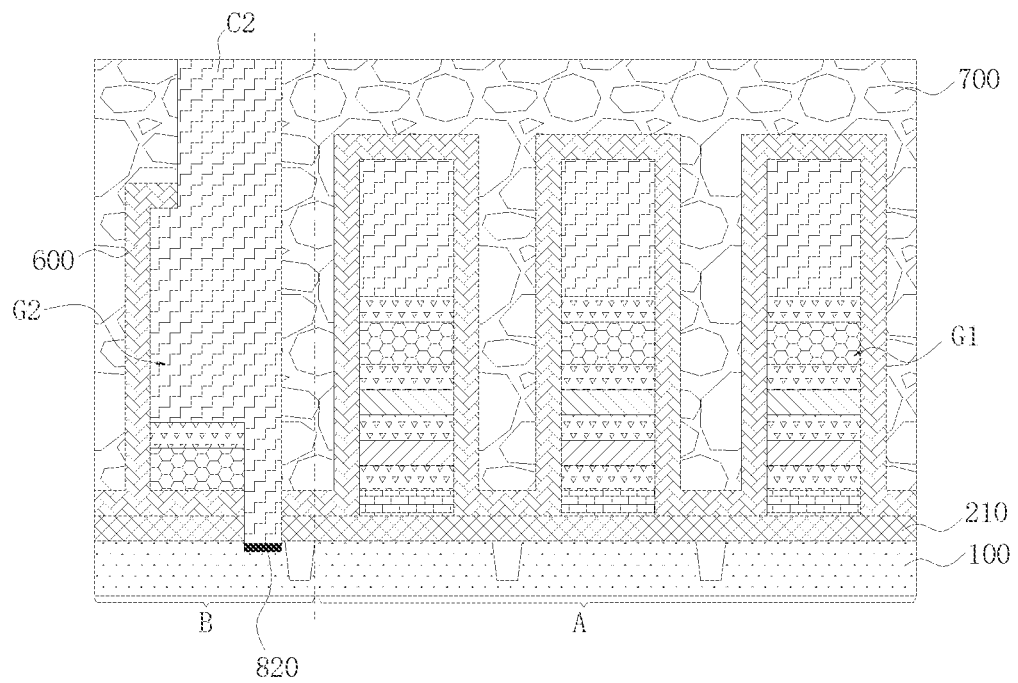

As shown in FIG. 13 and FIG. 14, in an embodiment of the present disclosure, the spacer 600 in the second region B covers the oxide insulating layer 210 and a top surface and side surfaces of the second gate structure G2. On this basis, the second gate structure G2 further includes another spacer, which is positioned between the second gate electrode layer and the oxide insulating layer 210. In other words, in the embodiment as shown in FIG. 13 and FIG. 14, the top surface, the side surfaces and a bottom surface of the second gate structure G2 (not including the oxide insulating layer 210 and only including the second gate electrode layer) are covered with the spacer 600.

Figure 27:
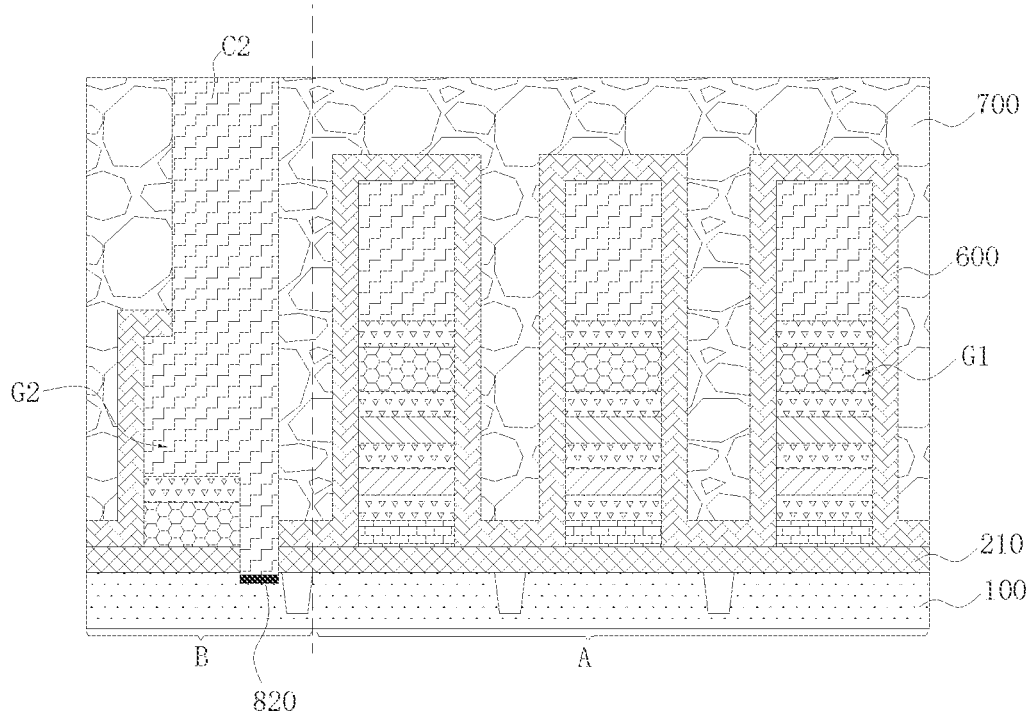

As shown in FIG. 26 and FIG. 27, in an embodiment of the present disclosure, the second gate structure G2 (not including the oxide insulating layer 210 and only including the second gate electrode layer) may be positioned on the substrate 100. That is, the spacer 600 in the second region B only covers the top surface and the side surfaces of the second gate structure G2, but does not cover the bottom surface of the second gate structure G2.

As shown in FIG. 26 and FIG. 27, in an embodiment of the present disclosure, the interlayer dielectric layer 700 is positioned on the spacer 600, and the interlayer dielectric layer 700 covers the spacer 600.

In an embodiment of the present disclosure, both the first region A and the second region B may be positioned in a peripheral circuit region of the semiconductor structure. On this basis, the second region B may be understood as a region positioned in the peripheral circuit region where a protect gate is arranged, i.e., a region where the second gate structure G2 is arranged. Through the above design, in the semiconductor structure of the present disclosure, a design is adopted where the protect gate in the peripheral circuit region includes a gate electrode layer and an oxide insulating layer, such that the problem of metal diffusion pollution of the HK layer in the existing solution can be avoided while reducing the connection area of metal on the upper layer, thereby protecting the device performance from the effect of pollution.

It is to be noted here that the semiconductor structures illustrated in the drawings and described in this specification are merely a few examples of various semiconductor structures that can employ the principles of the present disclosure. It is to be clearly understood that the principles of the present disclosure are in no way limited to any details or components of the semiconductor structure illustrated in the drawings or described in this specification.

Based on the above detailed description of several exemplary embodiments of the semiconductor structure proposed by the present disclosure, exemplary embodiments of the method for fabricating a semiconductor structure proposed by the present disclosure will be described in detail below.

Figure 2:
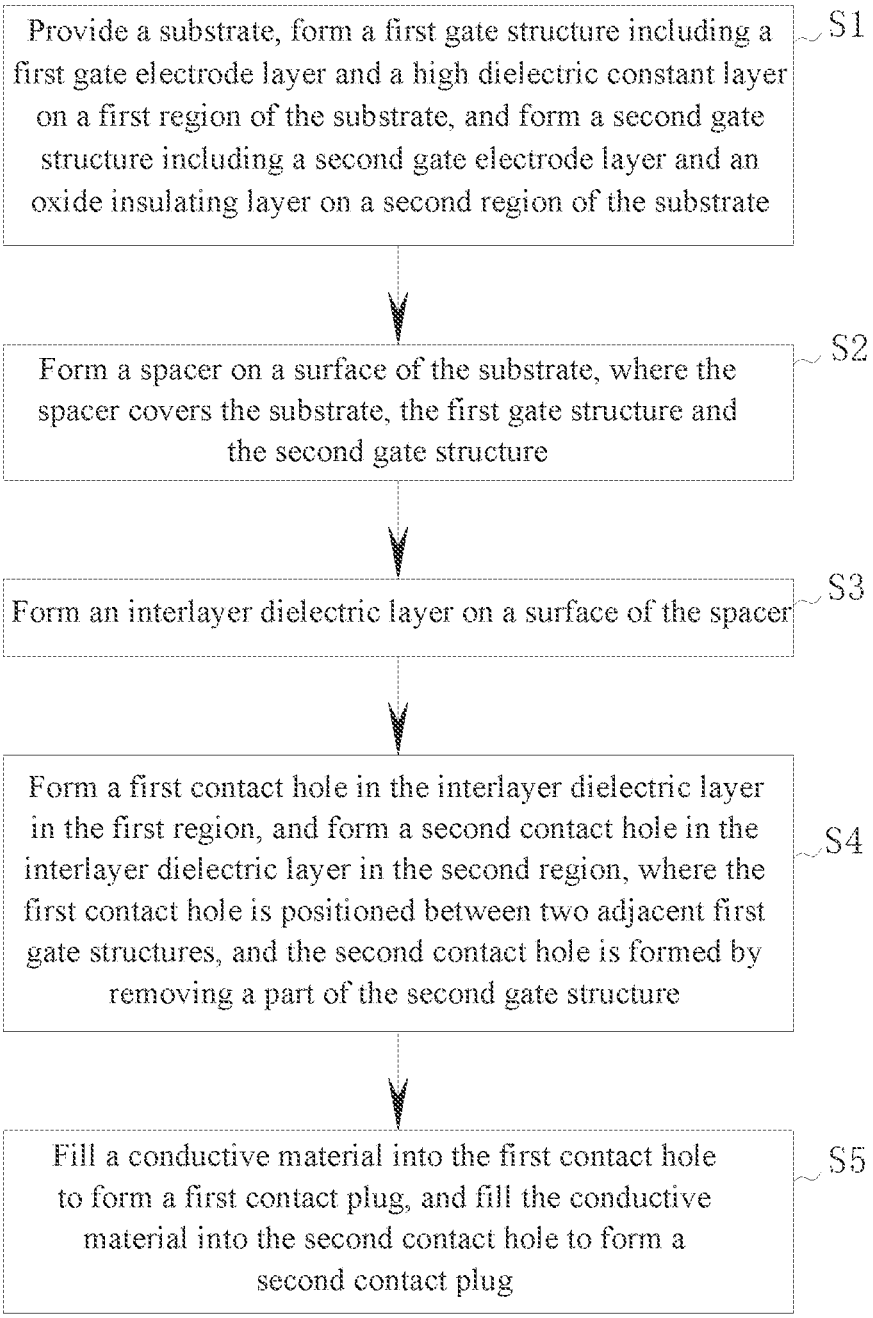
FIG. 2 is a schematic flowchart of a method for fabricating a semiconductor structure according to the present disclosure.

Referring to FIG. 2, a schematic flow chart of a method for fabricating a semiconductor structure proposed by the present disclosure is typically shown. In this exemplary embodiment, the method for fabricating a semiconductor structure proposed by the present disclosure is illustrated by taking an example where the method is applied to a DRAM. It is readily comprehensible to those skilled in the art that to apply relevant design of the present disclosure to other types of semiconductor structures, various modifications, additions, substitutions, deletions or other variations are made to the following embodiments, and these variations are still within the scope of the principle of the method for fabricating a semiconductor structure proposed in the present disclosure.

As shown in FIG. 2, the method for fabricating a semiconductor structure proposed by the present disclosure includes:

Step S1: providing a substrate 100, forming a first gate structure G1 on a first region A of the substrate 100, and forming a second gate structure G2 on a second region B of the substrate 100, where the first gate structure G1 is a high dielectric constant gate, and includes a first gate electrode layer and a high dielectric constant layer, and the second gate structure G2 includes a second gate electrode layer and an oxide insulating layer 210;

Step S2: forming a spacer 600 on a surface of the substrate 100, where the spacer 600 is positioned on the first gate structure G1 and the second gate structure G2, and covers the substrate 100, the first gate structure G1 and the second gate structure G2;

Step S3: forming an interlayer dielectric layer 700 on a surface of the spacer 600, where the interlayer dielectric layer 700 is positioned on the spacer 600 and covers the spacer 600;

Step S4: removing a part of the second gate structure G2, a part of the spacer 600 and the interlayer dielectric layer 700 to form a second contact hole V2; and Step S5: filling a conductive material 800 into the second contact hole V2 to form a second contact plug C2 partially lapped with the second gate structure G2.

Through the above-mentioned process design, different from the existing solution where a gate structure comprising a gate electrode layer and a high dielectric constant layer is adopted for gates in all regions, in the present disclosure, a gate structure comprising a gate electrode layer and an oxide insulating layer is adopted for the second region of the semiconductor structure, such that the above two gate structures jointly constitute the entire gate of the semiconductor structure. Hereby, the present disclosure adopts the gate structure comprising the gate electrode layer and the oxide insulating layer, such that the problem of metal diffusion pollution of the HK layer in the existing solution can be avoided while reducing the connection area of metal on the upper layer, thereby protecting the device performance from the effect of pollution.

Referring to FIGS. 3 to 14, FIGS. 3 to 14 respectively typically illustrate schematic diagrams of a stacked structure of the semiconductor structure in several steps of the method for fabricating a semiconductor structure according to an exemplary embodiment. Main process steps of the method for fabricating a semiconductor structure proposed by the present disclosure will be described in detail below with reference to the above drawings.

As shown in FIGS. 3 to 6, in an embodiment of the present disclosure, Step S1 may include:
- forming a thin-film stacked structure on the substrate 100, where the thin-film stacked structure includes an oxide insulating layer 210 and a high dielectric constant layer, and the oxide insulating layer 210 is a lowermost layer;
- forming a first gate material layer 300 on the thin-film stacked structure;
- removing a part of the first gate material layer 300 and the thin-film stacked structure by etching to form the first gate structure G1, and stopping etching upon exposing an upper surface of the oxide insulating layer 210;
- forming a second gate material layer 400 on the oxide insulating layer 210, where the second gate material layer 400 covers the first gate structure G1; and
- removing a part of the second gate material layer 400 by etching, where rest of the second gate material layer 400 and the oxide insulating layer 210 jointly constitute the second gate structure G2.

Figure 3:
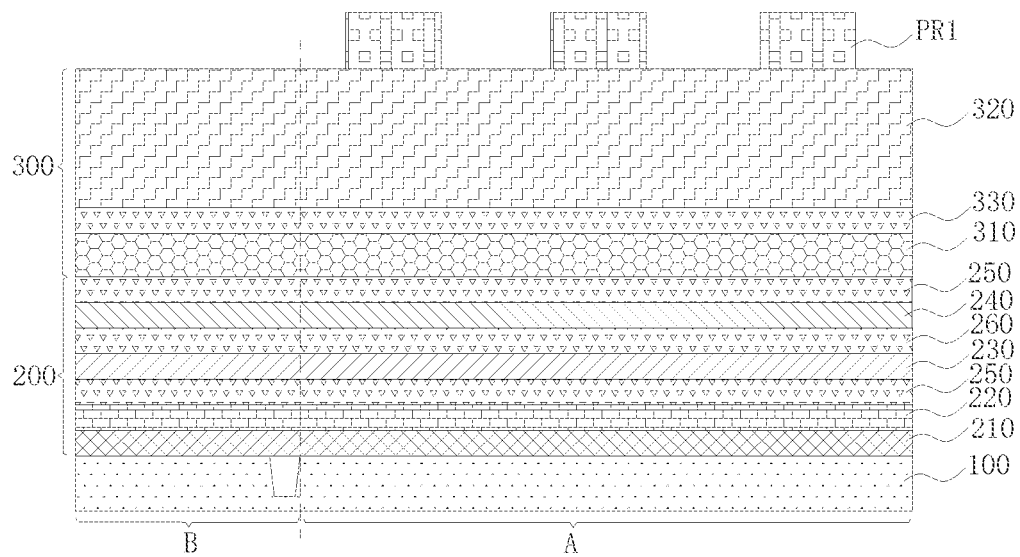
FIGS. 3 to 14 respectively illustrate schematic diagrams of a stacked structure of a semiconductor structure in several steps of the method for fabricating a semiconductor structure according to an exemplary embodiment.
Figure 4:
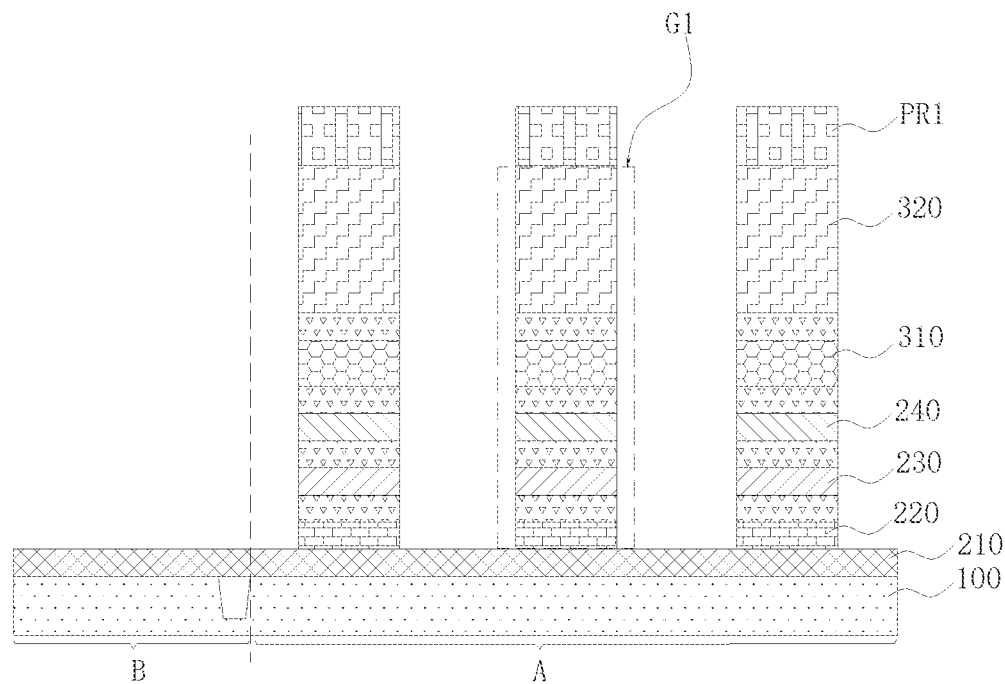

As shown in FIG. 3 and FIG. 4, in an embodiment of the present disclosure, the step of "removing a part of the first gate material layer 300 and the thin-film stacked structure by etching" may include:
- depositing a first photoresist layer PR1 on the first gate material layer 300;
- patterning the first photoresist layer PR1; and
- removing a part of the first gate material layer 300 and the thin-film stacked structure by etching by means of the patterned first photoresist layer PR1 to form the first gate structure G1.

In some embodiments, as shown in FIG. 3, in an embodiment of the present disclosure, in the steps of "forming a thin-film stacked structure on the substrate 100, where the thin-film stacked structure includes an oxide insulating layer 210 and a high dielectric constant layer, and the oxide insulating layer 210 is a lowermost layer", "forming a first gate material layer 300 on the thin-film stacked structure", and "depositing a first photoresist layer PR1 on the first gate material layer 300", the semiconductor structure includes the substrate 100, the thin-film stacked structure, the first gate material layer 300, and the first photoresist layer PR1. The thin-film stacked structure is positioned on the surface of the substrate 100. The first gate material layer 300 is positioned on the surface of the thin-film stacked structure. The first photoresist layer PR1 is positioned on the surface of the first gate material layer 300, and the first photoresist layer PR1 is patterned to form a photolithographic pattern.

In some embodiments, as shown in FIG. 3, in an embodiment of the present disclosure, the thin-film stacked structure may include an oxide insulating layer 210 and a high dielectric constant layer formed on the surface of the substrate 100 in sequence from bottom to top, and the high dielectric constant layer includes a high dielectric constant insulating layer 220 and a high dielectric constant metal layer formed on the surface of the oxide insulating layer 210 in sequence from bottom to top. The high dielectric constant metal layer may include two layers, e.g., an aluminum oxide (AlO) metal layer and a lanthanum oxide (LaO) metal layer. A first dielectric material layer 250 is respectively formed between the high dielectric constant insulating layer 220 and the high dielectric constant metal layer, between the high dielectric constant insulating layer 220 and the first gate material layer 300, and between the high dielectric constant metal layer and the first gate material layer 300; and a second dielectric material layer 260 is formed between the aluminum oxide metal layer 230 and the lanthanum oxide metal layer 240, and the material of the first dielectric material layer 250 may be, but not limited to, the same as that of the second dielectric material layer 260, for example, titanium nitride.

In an embodiment of the present disclosure, the material of the oxide insulating layer 210 may include, but not limited to, silicon oxynitride (SiON).

In some embodiments, as shown in FIG. 3, in an embodiment of the present disclosure, the first gate material layer 300 may include a polysilicon layer 310 and a metal layer 310 (e.g., tungsten W) formed on the surface of the thin-film stacked structure (e.g., a barrier material on a topmost layer) in sequence from bottom to top. In addition, a first barrier layer 330 may be formed between the polysilicon layer 310 and the metal layer 310, where a material of the first barrier layer 330 is titanium nitride for example, but not limited thereto.

In some embodiments, as shown in FIG. 4, in an embodiment of the present disclosure, in the step of "removing a part of the first gate material layer 300 and the thin-film stacked structure by etching by means of the patterned first photoresist layer PR1 to form the first gate structure G1", the semiconductor structure includes the substrate 100, the thin-film stacked structure and the first gate material layer 300 partially removed by etching, and rest of the first photoresist layer PR1. Rest of the thin-film stacked structure and rest of the first gate material layer 300 jointly constitute the first gate structure G1, where rest of the first gate material layer 300 is the first gate electrode layer. Moreover, in the above-mentioned process, the etching stops upon exposing the upper surface of the oxide insulating layer 210. That is, the oxide insulating layer 210 is not removed in the above-mentioned etching process, and still covers the surface of the substrate 100.

Figure 5:
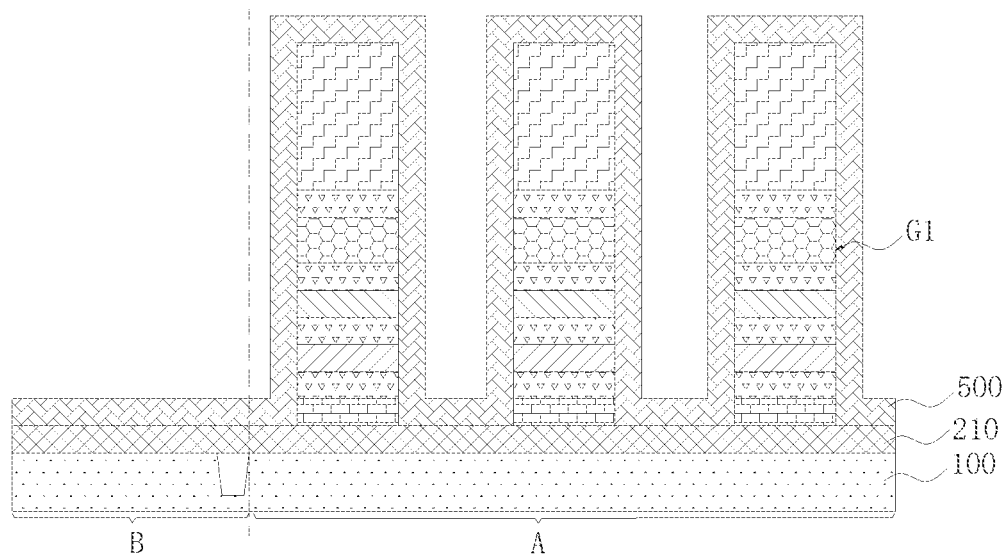

In an embodiment of the present disclosure, after the step of "forming a first gate structure G1", the method also includes a step of removing rest of the first photoresist layer PR1, and reference is made to FIG. 5 for details.

As shown in FIG. 5, in an embodiment of the present disclosure, before the step of "forming a second gate material layer 400 on the oxide insulating layer 210", the method may further include:
- forming a mask layer 500 on the surface of the first gate structure G1 and the oxide insulating layer 210.

In some embodiments, as shown in FIG. 5, in an embodiment of the present disclosure, in the step of "forming a mask layer 500 on the surface of the first gate structure G1 and the oxide insulating layer 210", the semiconductor structure includes the substrate 100, the oxide insulating layer 210, the first gate structure G1, and the mask layer 500. The mask layer 500 covers the first gate structure G1 and the oxide insulating layer 210.

In an embodiment of the present disclosure, a material of the mask layer 500 may include, but is not limited to, silicon nitride ($Si_3N_4$).

In an embodiment of the present disclosure, the step of "removing a part of the second gate material layer 400 by etching, where rest of the second gate material layer 400 and the oxide insulating layer 210 jointly constitute the second gate structure G2" may include:
- depositing a second photoresist layer on the second gate material layer 400;
- patterning the second photoresist layer; and
- removing a part of the second gate material layer 400 by etching by means of the patterned second photoresist layer, to form the second gate structure G2.

Figure 6:
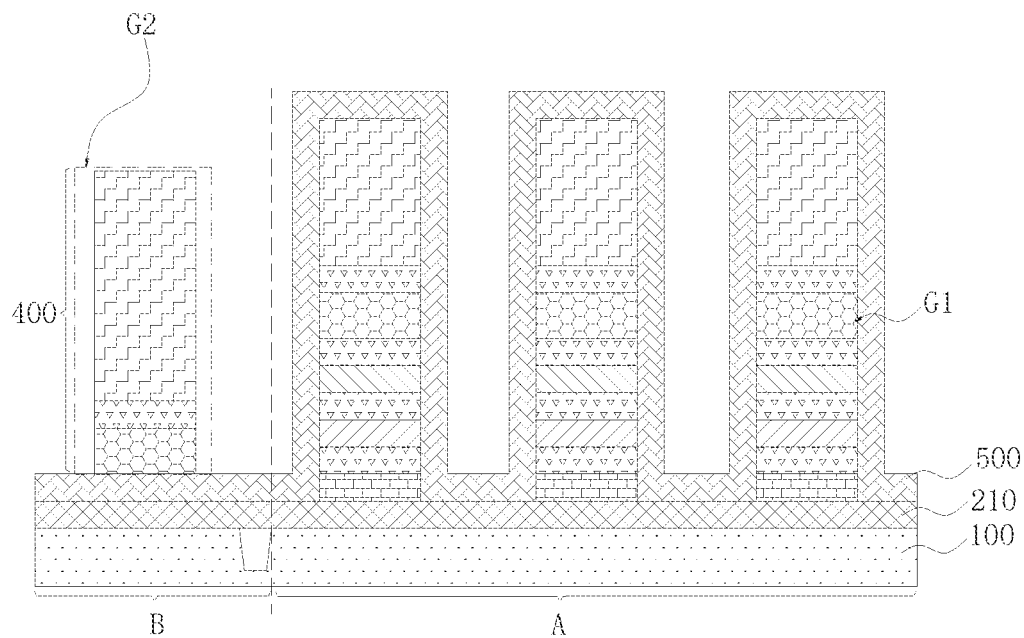

In some embodiments, as shown in FIG. 6, in an embodiment of the present disclosure, in the step of "removing a part of the second gate material layer 400 by etching by means of the patterned second photoresist layer, to form the second gate structure G2", the semiconductor structure includes the substrate 100, the first gate structure G1, the mask layer 500, and the second gate material layer 400 partially removed by etching. Rest of the second gate material layer 400 and the oxide insulating layer 210 therebelow jointly constitute the second gate structure G2, where rest of the second gate material layer 400 is the second gate electrode layer. In addition, in the above-mentioned process, the etching stops upon exposing the upper surface of the mask layer 500. That is, the mask layer 500 is not removed in the above-mentioned etching process, and still covers the surface of the first gate structure G1 and the oxide insulating layer 210.

Figure 7:
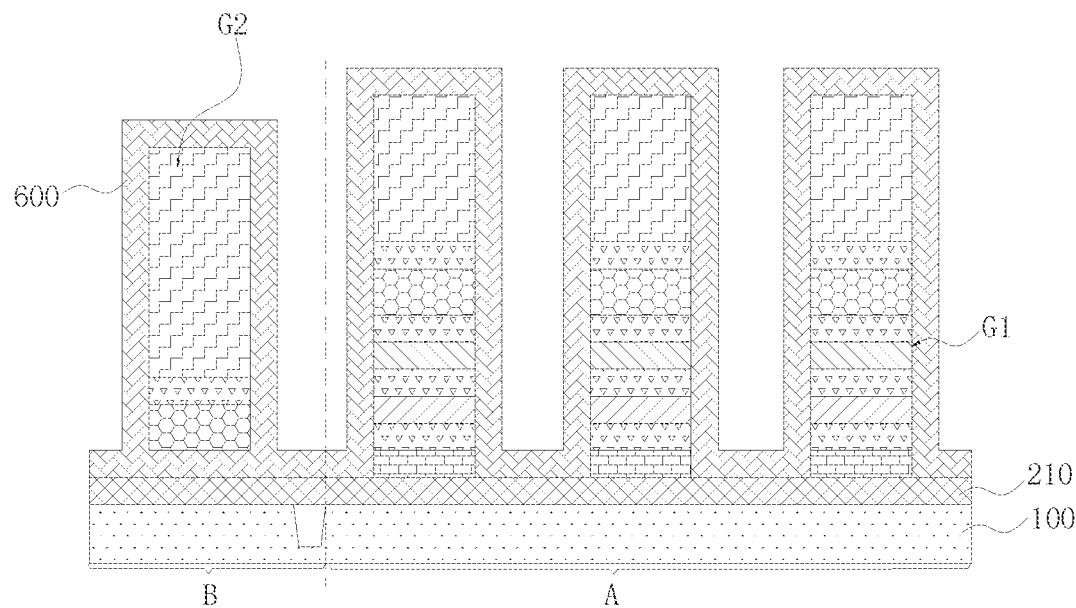

As shown in FIG. 7, in an embodiment of the present disclosure, in Step S2, the semiconductor structure includes the substrate 100, the first gate structure G1, the second gate structure G2, and the spacer 600. In this embodiment, a description is made by taking an example where a material of the spacer 600 is the same as that of the mask layer 500. That is, the material of the spacer 600 may be, but not limited to, silicon nitride. On this basis, FIG. 7 shows a layered structure obtained after the spacer 600 is formed, where the spacer 600 at this moment includes the mask layer 500. In addition, in Step S2, after the spacer 600 is formed, ion implantation may be performed on a source/drain (S/D).

Figure 8:
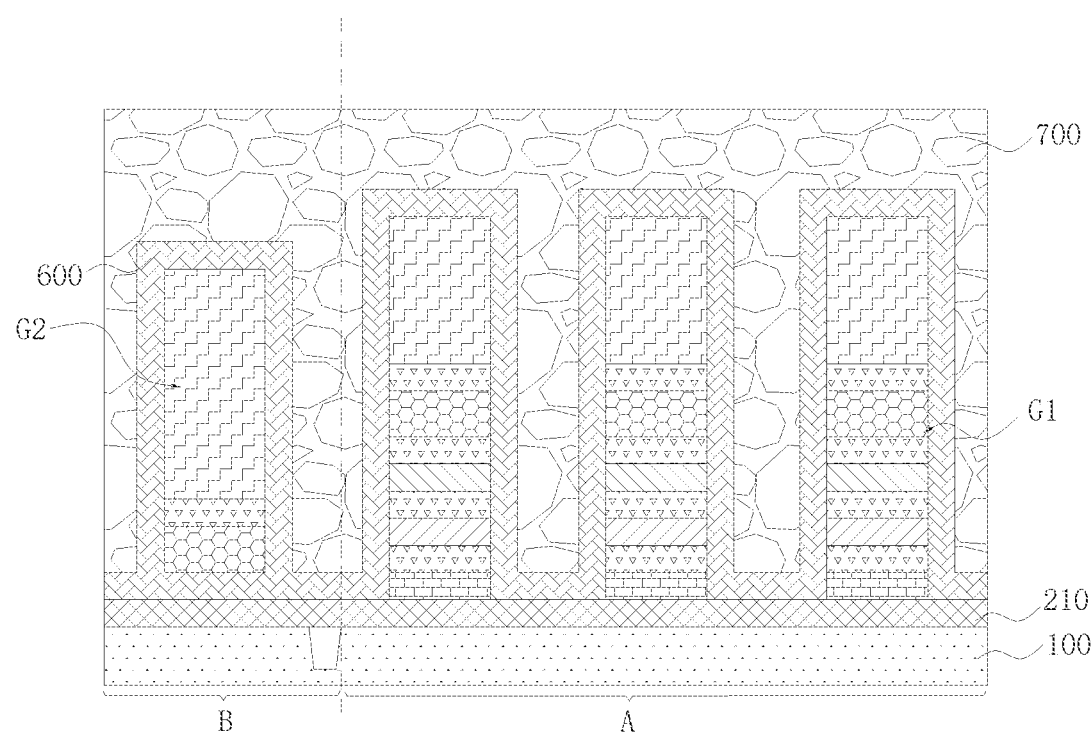

As shown in FIG. 8, in an embodiment of the present disclosure, in Step S3, the semiconductor structure includes the substrate 100, the first gate structure G1, the second gate structure G2, the spacer 600, and the interlayer dielectric layer 700. The interlayer dielectric layer 700 covers the surface of the spacer 600.

Figure 9:
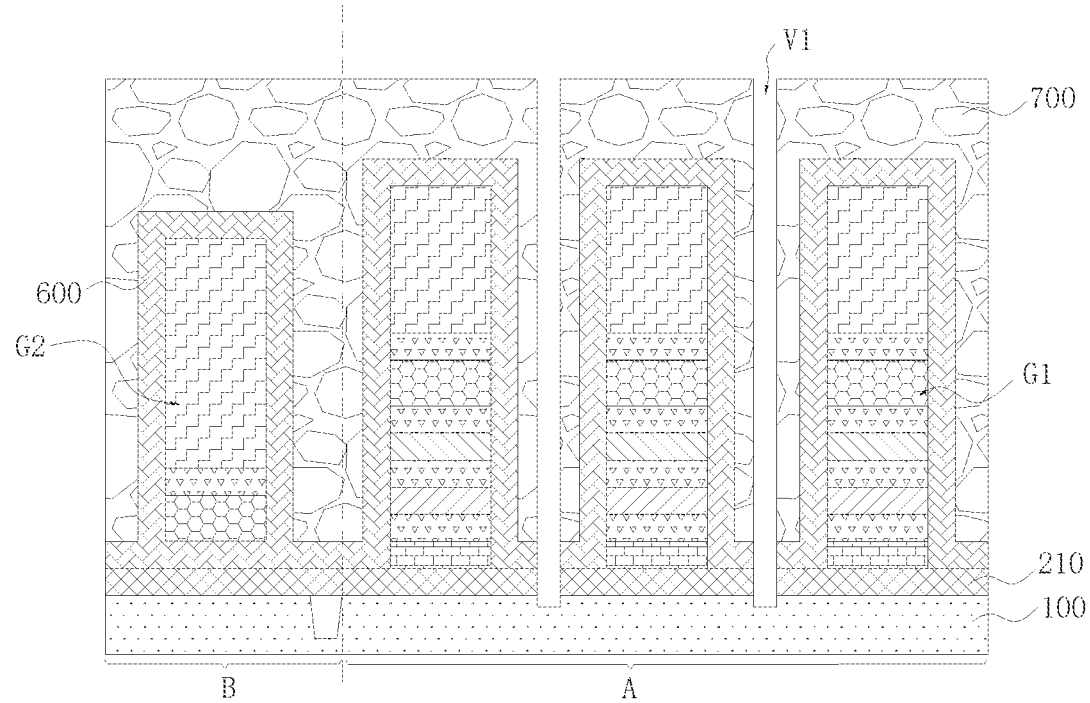
Figure 11:
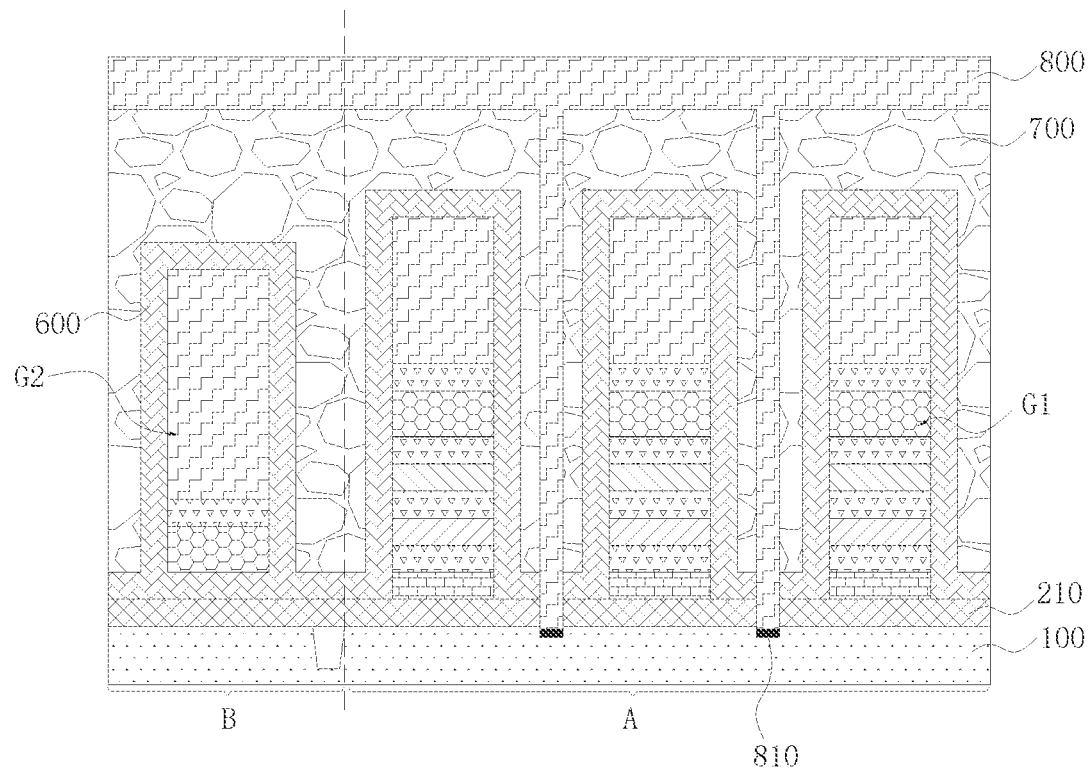

As shown in FIG. 9, FIG. 11 and FIG. 13, in an embodiment of the present disclosure, after the step of "forming an interlayer dielectric layer 700 on the surface of the spacer 600", the method may further include:
  forming a first contact hole V1 in the interlayer dielectric layer 700 positioned in the first region A, where the first contact hole V1 is spaced apart from the first gate structure G1; and
  filling a conductive material 800 into the first contact hole V1 to form a first contact plug C1.

As shown in FIG. 9, in an embodiment of the present disclosure, in Step S4, the semiconductor structure includes the substrate 100, the first gate structure G1, the second gate structure G2, the spacer 600, and the interlayer dielectric layer 700. The first contact hole V1 is formed on a location between two adjacent first gate structures G1 corresponding to the interlayer dielectric layer 700, a top of the first contact hole V1 is opened on the surface of the interlayer dielectric layer 700, and a lower end of the first contact hole V1 extends and invades into the substrate 100. In other words, the first contact hole V1 penetrates through the oxide insulating layer 210 covering the substrate 100 to expose a part of the substrate 100. It should be noted that the stacked structure shown in FIG. 9 is a cross-sectional structure taken along a first direction of the semiconductor structure in a top view. In this view, the first contact hole V1 can be observed, but the second contact hole V2 cannot be observed.

Figure 10:
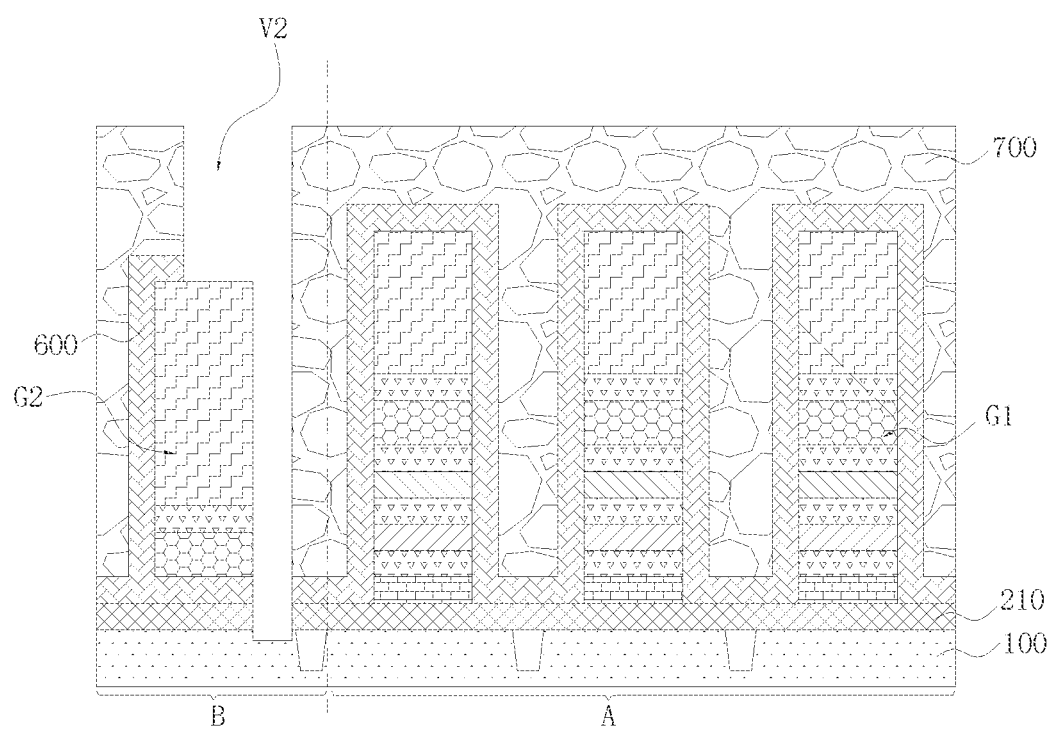

As shown in FIG. 10, in an embodiment of the present disclosure, in Step S4, the second contact hole V2 is formed in the interlayer dielectric layer 700 in the second region B. A top of the second contact hole V2 is opened on the surface of the interlayer dielectric layer 700, and a part of a lower end of the second contact hole V2 extends to a part of the upper surface of the second gate structure G2, and another part of the lower end of the second contact hole V2 continues to extend and invades into the substrate 100. In other words, a part of the second contact hole V2 penetrates through the spacer 600 covering the second gate structure G2 to expose the first part of top surface and the first side surface of the second gate structure G2, and another part of the second contact hole V2 penetrates through the oxide insulating layer 210 covering the substrate 100 to expose a part of the substrate 100. Hence, the second contact hole V2 may be understood as being formed by removing a part of the spacer 600 covering the surface of the second gate structure G2. It should be noted that the stacked structure shown in FIG. 10 is a cross-sectional structure taken along a second direction of the semiconductor structure in the top view. In this view, the second contact hole V2 can be observed, but the first contact hole V1 cannot be observed.

As shown in FIGS. 11 to 14, in an embodiment of the present disclosure, the step of "filling a conductive material 800 into the first contact hole V1, and filling the conductive material 800 into the second contact hole V2" may include:
  covering the interlayer dielectric layer 700 with the conductive material 800, where the conductive material 800 is filled into the first contact hole V1 and the second contact hole V2; and
  polishing to remove the conductive material 800 covering the upper surface of the interlayer dielectric layer 700.

Figure 12:
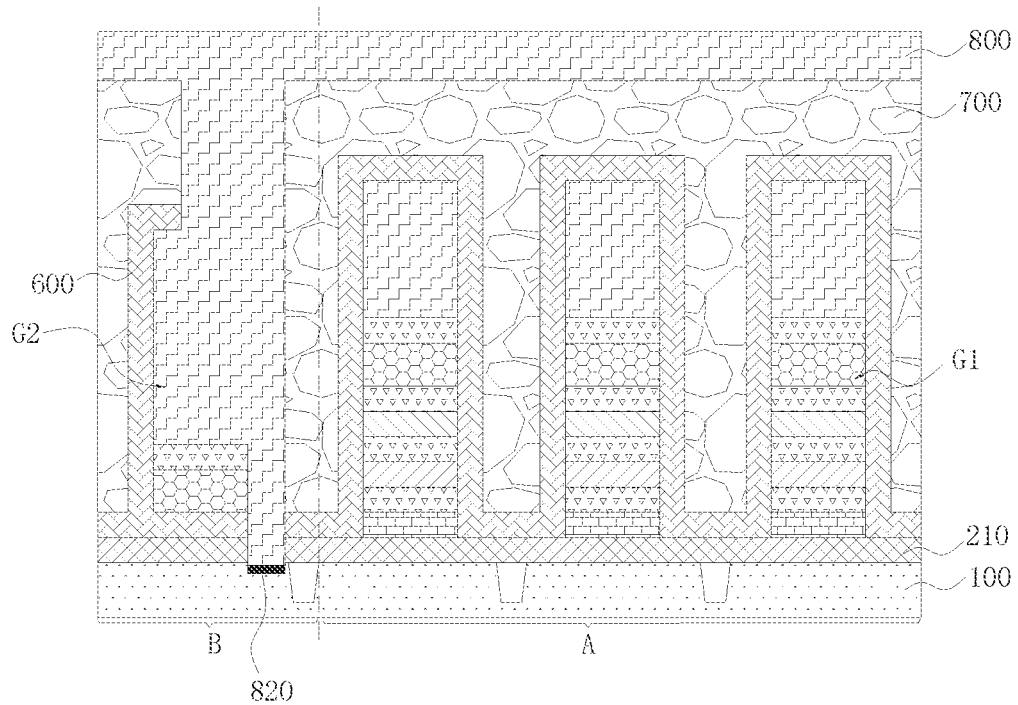

As shown in FIG. 11 and FIG. 12, in an embodiment of the present disclosure, in the step of "covering the interlayer dielectric layer 700 with the conductive material 800", the semiconductor structure includes the substrate 100, the first gate structure G1, the second gate structure G2, the spacer 600, the interlayer dielectric layer 700, and the conductive material 800. The conductive material 800 is covered on the surface of the interlayer dielectric layer 700 and is filled into the first contact hole V1 and the second contact hole V2. The first part of top surface and the first side surface of the second gate structure G2 are exposed to the second contact hole V2, so the conductive material 800 filled into the second contact hole V2 is lapped with the exposed second gate structure G2. On this basis, a projection of the second contact plug C2 on the substrate 100 is partially overlapped with a projection of the second gate structure G2 on the substrate 100.

As shown in FIG. 11 and FIG. 12, in an embodiment of the present disclosure, before the step of "filling a conductive material 800 into the first contact hole V1, and filling the conductive material 800 into the second contact hole V2", the method may also include:
  forming a first contact layer 810 at a bottom of the first contact hole V1, and forming a second contact layer 820 at a bottom of the second contact hole V2.

As shown in FIG. 11 and FIG. 12, in an embodiment of the present disclosure, the conductive material 800 filled into the first contact hole V1 and the conductive material 800 filled into the second contact hole V2 are separated from the exposed substrate 100 by the first contact layer 810 and the second contact layer 820, respectively.

In an embodiment of the present disclosure, a material of the first contact layer 810 may be, but not limited to, the same as that of the second contact layer 820, including cobalt silicide ($CoSi_x$) for example. In some embodiments of the present disclosure, before the conductive material 800 is filled, cobalt (Co) is firstly filled at the bottom of the first contact hole V1 and the second contact hole V2. Because the substrate 100 is exposed to the bottom of the first contact hole V1 and the second contact hole V2, the cobalt filled in the above process and the silicon (Si) on the substrate 100 can form cobalt silicide at high temperature.

As shown in FIG. 13 and FIG. 14, in an embodiment of the present disclosure, in the step of "polishing to remove the conductive material 800 covering the upper surface of the interlayer dielectric layer 700", the semiconductor structure includes the substrate 100, the first gate structure G1, the second gate structure G2, the spacer 600, the interlayer dielectric layer 700, and rest of the conductive material 800 remained after the polishing. A part of the conductive material 800 covering the surface of the interlayer dielectric layer 700 is removed by polishing, and rest of the conductive material 800 is filled into the first contact hole V1 and the second contact hole V2, thereby forming the first contact plug C1 and the second contact hole V2, respectively. Furthermore, through the polishing process, an upper surface of the first contact plug C1 and an upper surface of the second contact plug C2 may be flush with the upper surface of the interlayer dielectric layer 700.

It should be noted that in this embodiment, a description is made by taking an example where a material of the first contact plug C1 is the same as that of the second contact plug C2. In some embodiments, when the material of the first contact plug C1 is different from that of the second contact plug C2, the first contact plug C1 and the second contact plug C2 are formed in the first contact hole V1 and the second contact hole V2 respectively by depositing and polishing the conductive material 800 made from different materials, which is not limited thereto.

Referring to FIGS. 15 to 27, FIGS. 15 to 27 respectively typically illustrate schematic diagrams of the stacked structure of the semiconductor structure in several steps of the method for fabricating a semiconductor structure according to another exemplary embodiment. In this embodiment, Steps S2 to S5 are substantially the same as the above embodiments shown in FIGS. 2 to 14, and process design in this embodiment different from process design in other embodiments will be described in detail below.

As shown in FIGS. 15 to 20, in an embodiment of the present disclosure, Step S1 may include:

forming a thin-film stacked structure on the substrate 100, where the thin-film stacked structure includes an oxide insulating layer 210 and a high dielectric constant layer, and the oxide insulating layer 210 is a lowermost layer;

removing the thin-film stacked structure positioned in the second region B by etching, and stopping etching upon exposing an upper surface of the oxide insulating layer 210;

covering the first gate material layer 300 and the second gate material layer 400 on the thin-film stacked structure and the oxide insulating layer 210 in the second region B, respectively; and removing a part of the first gate material layer 300 and a part of the thin-film stacked structure by etching to form the first gate structure G1, stopping etching upon exposing the upper surface of the oxide insulating layer 210, and removing a part of the second gate material layer 400 by etching, rest of the second gate material layer 400 and the oxide insulating layer 210 jointly constituting the second gate structure G2.

Figure 15:
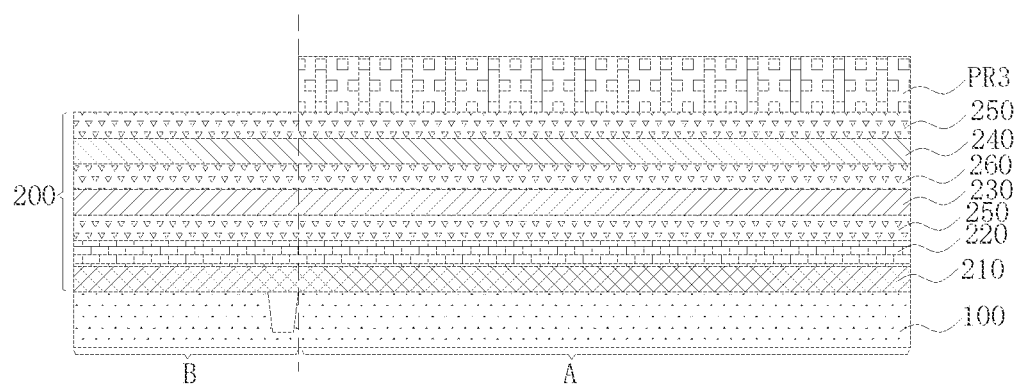
FIGS. 15 to 27 respectively illustrate schematic diagrams of the stacked structure of the semiconductor structure in several steps of the method for fabricating a semiconductor structure according to another exemplary embodiment.
Figure 16:
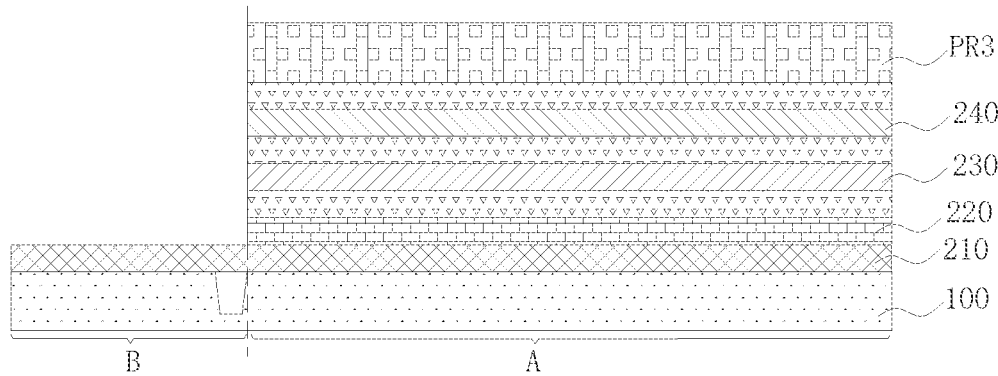

As shown in FIG. 15 and FIG. 16, in an embodiment of the present disclosure, the step of "removing the thin-film stacked structure positioned in the second region B by etching" may include:

depositing a third photoresist layer PR3 on the thin-film stacked structure;

patterning the third photoresist layer PR3; and removing the thin-film stacked structure positioned in the second region B by etching by means of the patterned third photoresist layer PR3.

In some embodiments, as shown in FIG. 15, in an embodiment of the present disclosure, in the step of "depositing a third photoresist layer PR3 on the thin-film stacked structure" and the step of "patterning the third photoresist layer PR3", the semiconductor structure includes the substrate 100, the thin-film stacked structure, and the third photoresist layer PR3. The thin-film stacked structure is positioned on the surface of the substrate 100. The third photoresist layer PR3 is positioned on the surface of the thin-film stacked structure, and the third photoresist layer PR3 is patterned to form a photolithographic pattern.

In some embodiments, as shown in FIG. 16, in an embodiment of the present disclosure, in the step of "removing the thin-film stacked structure positioned in the second region B by etching by means of the patterned third photoresist layer PR3", the semiconductor structure includes the substrate 100, rest of the thin-film stacked structure remained after etching, and the third photoresist layer PR3. The etching stops upon exposing the upper surface of the oxide insulating layer 210. That is, the oxide insulating layer 210 is not removed in the above-mentioned etching process, and still covers the surface of the substrate 100. In other words, except for the oxide insulating layer 210, a part of the thin-film stacked structure positioned in the second region B is removed by etching, and rest of the thin-film stacked structure except for the oxide insulating layer 210 is positioned in the first region A. In addition, after the above-mentioned etching process is completed, the method also includes the step of removing rest of the third photoresist layer PR3.

Figure 17:
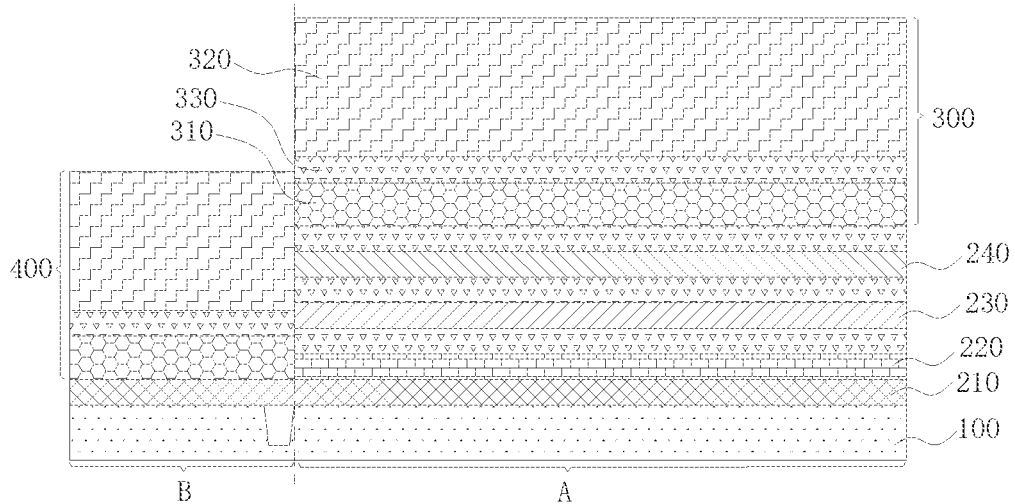

In some embodiments, as shown in FIG. 17, in an embodiment of the present disclosure, in the step of "covering the first gate material layer 300 and the second gate material layer 400 on the thin-film stacked structure and the oxide insulating layer 210 in the second region B, respectively", the semiconductor structure includes the substrate 100, rest of the thin-film stacked structure including all the oxide insulating layers 210, the first gate material layer 300, and the second gate material layer 400. The first gate material layer 300 covers the surface of the part of the thin-film stacked structure positioned in the first region A, for example, the surface of the barrier material on the topmost layer of rest of the thin-film stacked structure. The second gate material layer 400 covers the surface of the oxide insulating layer 210 in the second region B, i.e., the surface of the oxide insulating layer 210 exposed after the thin-film stacked structure is partially removed. In addition, in this embodiment, a description is made by taking an example where the first gate material layer 300 and the second gate material layer 400 are made from the same material. For example, the second gate material layer 400 includes a polysilicon layer, a metal layer, and a second barrier layer between the polysilicon layer and the metal layer. Therefore, the first gate material layer 300 and second gate material layer 400 may be formed in the same process. In some embodiments, when the first gate material layer 300 and the second gate material layer 400 are made from different materials, the first gate material layer 300 and second gate material layer 400 may be formed in two processes respectively, but not limited thereto.

Figure 18:
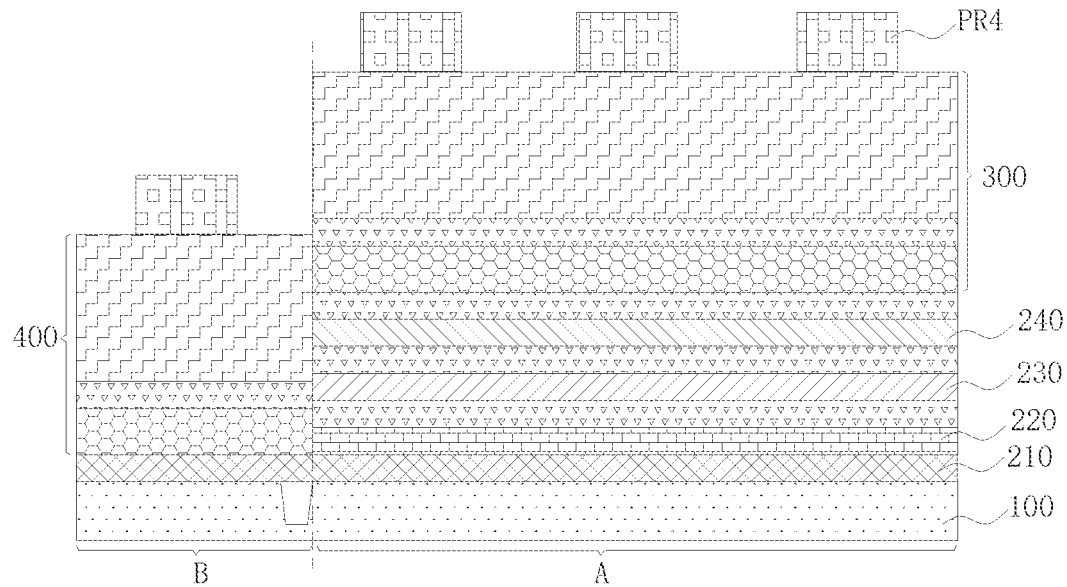
Figure 19:
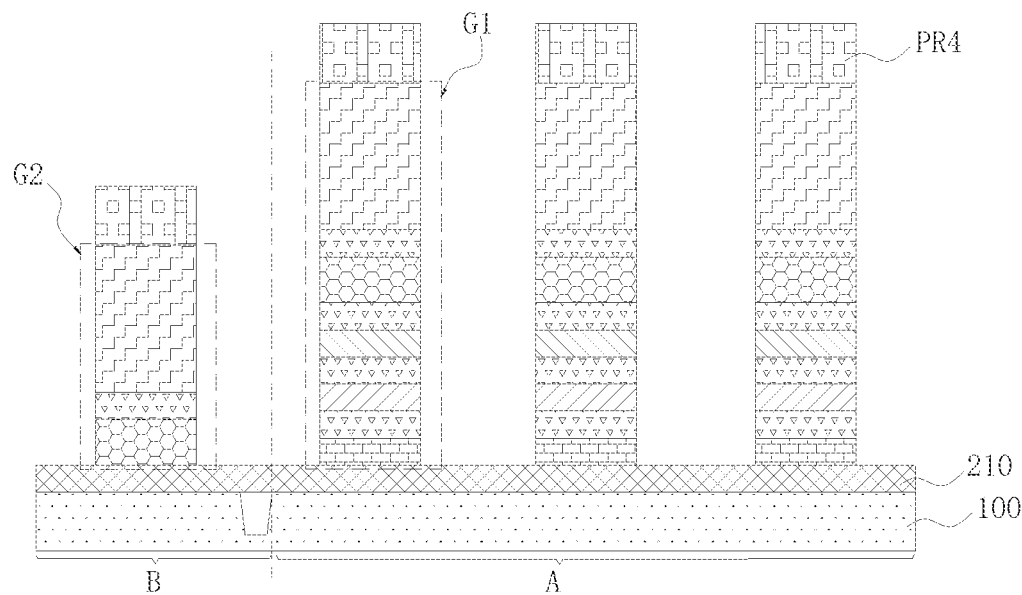
Figure 20:
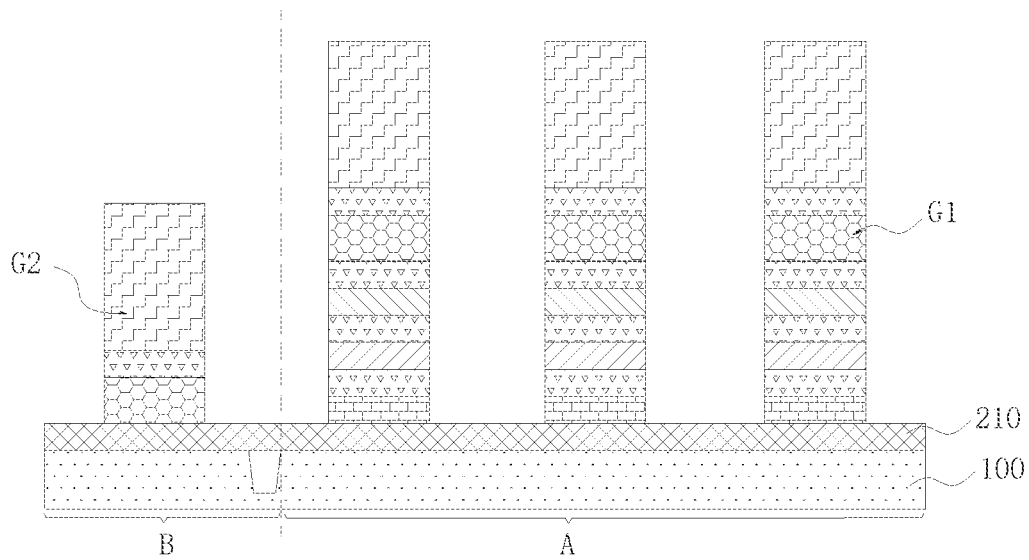

As shown in FIGS. 18 to 20, in an embodiment of the present disclosure, on the basis of a fact that the first gate material layer 300 and the second gate material layer 400 are made from the same material, the step of "removing a part of the first gate material layer 300 and a part of the thin-film stacked structure and removing a part of the second gate material layer 400 by etching" may include:

depositing a fourth photoresist layer PR4 on the first gate material layer 300 and the second gate material layer 400;

patterning the fourth photoresist layer PR4; and removing a part of the first gate material layer 300 and a part of the thin-film stacked structure and simultaneously removing a part of the second gate material layer 400 by etching by means of the patterned fourth photoresist layer PR4, to form the first gate structure G1 and the second gate structure G2, respectively.

In some embodiments, as shown in FIG. 18, in an embodiment of the present disclosure, in the step of "depositing a fourth photoresist layer PR4 on the first gate material layer 300 and the second gate material layer 400" and the step of "patterning the fourth photoresist layer PR4", the semiconductor structure includes the substrate 100, the oxide insulating layer 210, the first gate material layer 300 and the thin-film stacked structure, the second gate material layer 400, and the patterned fourth photoresist layer PR4. The patterned fourth photoresist layer PR4 is positioned on the first gate material layer 300 and the second gate material layer 400, respectively.

In some embodiments, as shown in FIG. 19, in an embodiment of the present disclosure, in the step of "removing a part of the first gate material layer 300 and a part of the thin-film stacked structure and simultaneously removing a part of the second gate material layer 400 by etching by means of the patterned fourth photoresist layer PR4", the semiconductor structure includes the substrate 100, the oxide insulating layer 210, rest of the first gate material layer 300 and the thin-film stacked structure remained after etching, and rest of the second gate material layer 400 and rest of the fourth photoresist layer PR4 remained after etching. Rest of the first gate material layer 300 and the thin-film stacked structure jointly constitute the first gate structure G1, and rest of the second gate material layer 400 constitutes the second gate structure G2. In addition, as shown in FIG. 20, after the above etching process, the method also includes the step of removing rest of the fourth photoresist layer PR4.

Figure 21:
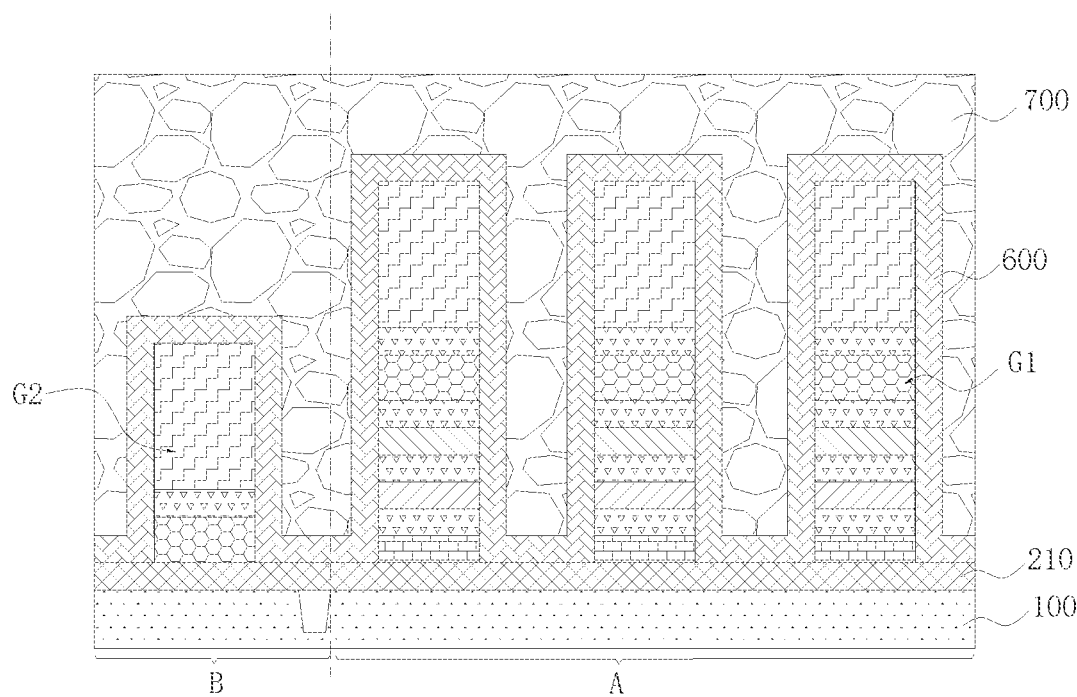
Figure 22:
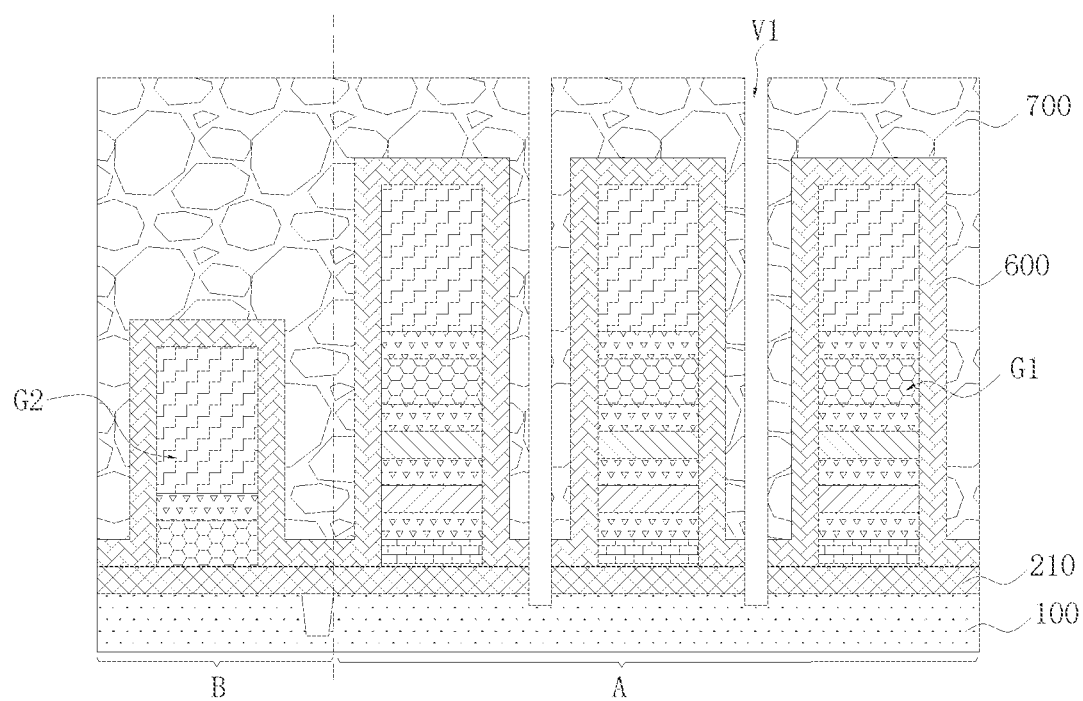
Figure 23:
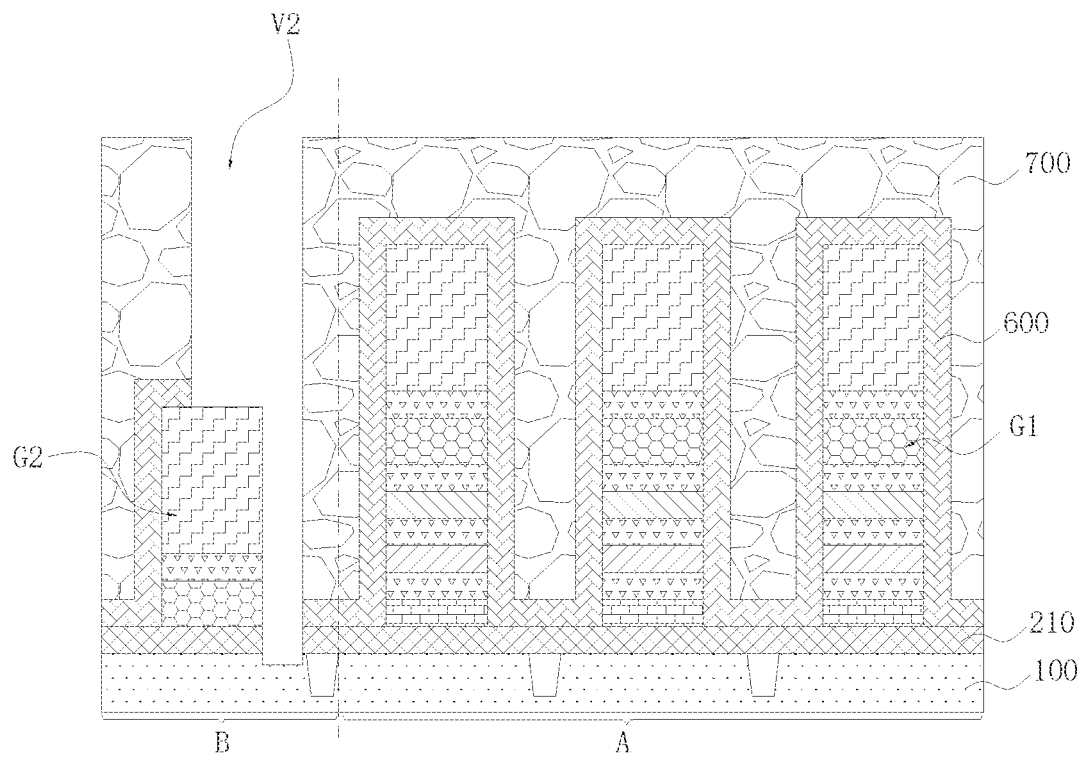
Figure 24:
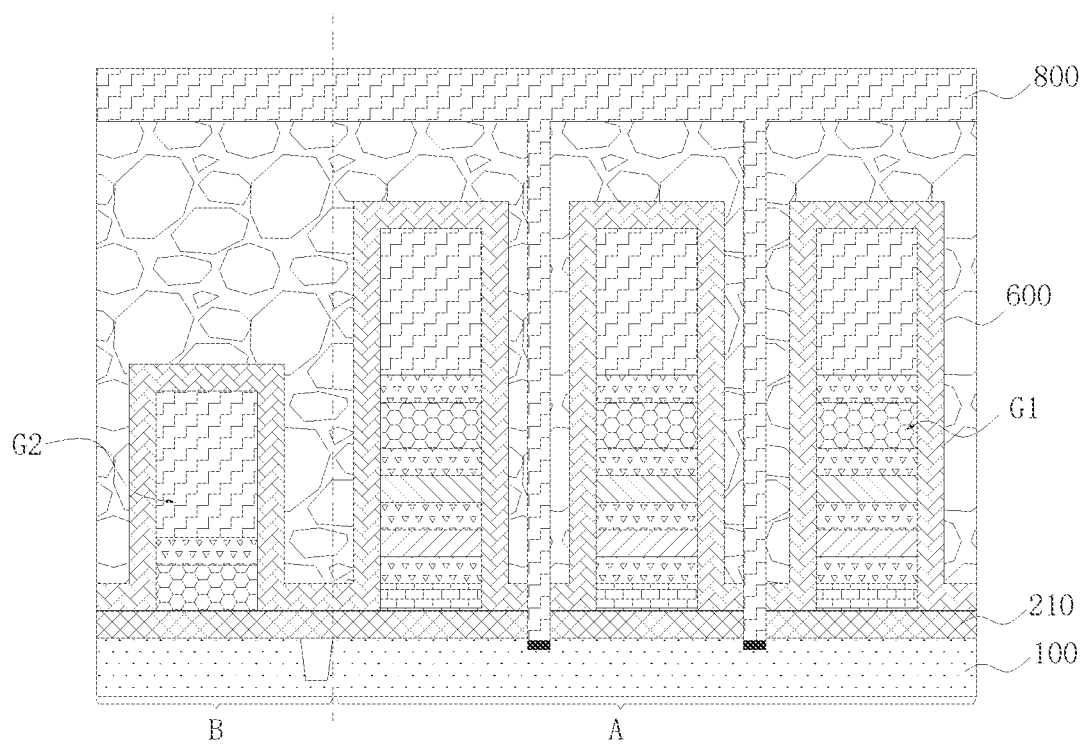
Figure 25:
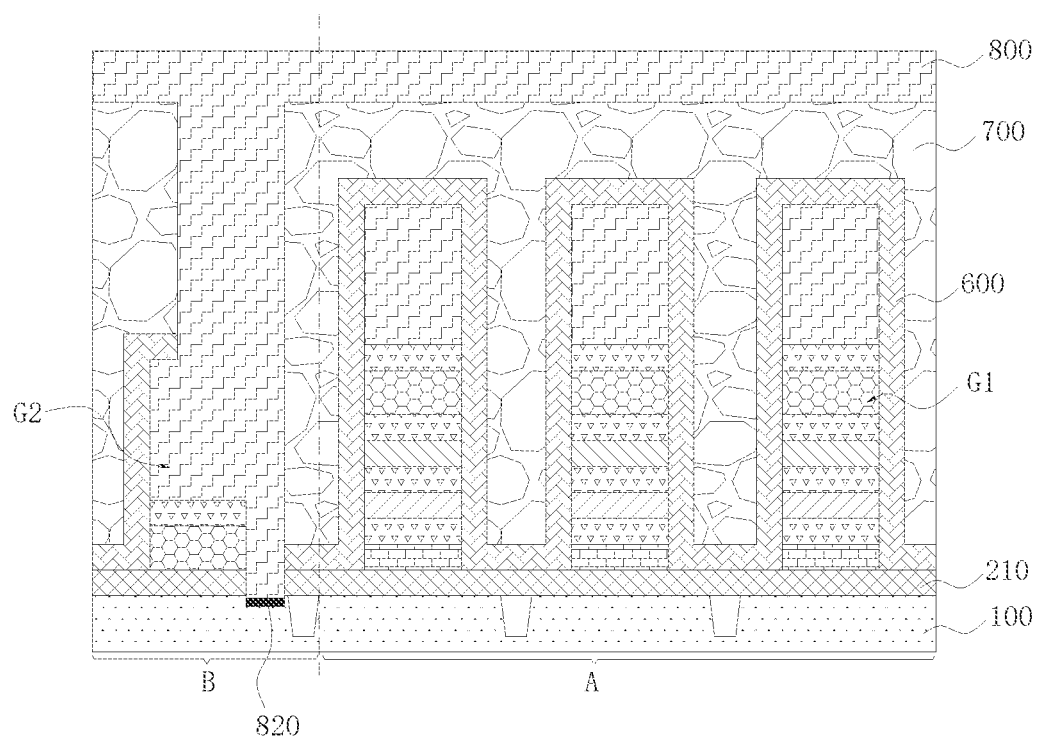

In some embodiments, as shown in FIG. 21, in an embodiment of the present disclosure, in Step S2 and Step S3, the semiconductor structure includes the substrate 100, the first gate structure G1, the second gate structure G2, the spacer 600, and the interlayer dielectric layer 700. The spacer 600 covers the first gate structure G1, the second gate structure G2, and an exposed part of the oxide insulating layer 210. The interlayer dielectric layer 700 covers the spacer 600. In addition, in Step S2, after the spacer 600 is formed and before the interlayer dielectric layer 700 is formed, ion implantation may be performed on the source/drain (S/D).

As shown in FIGS. 22 to FIG. 27, FIGS. 22 to 27 typically illustrate schematic diagrams of the stacked structure of the semiconductor structure in several step processes under Step S4 from different angles. The process design is substantially the same as that of the embodiments as shown in FIGS. 2 to 14, and thus the detailed description thereof is omitted here.

It is to be noted here that the method for fabricating a semiconductor structure shown in the drawings and described in this specification is only a few examples in methods for fabricating various semiconductor structures that can employ the principles of the present disclosure. It is to be clearly understood that the principles of the present disclosure are in no way limited to any details or steps of the method for fabricating a semiconductor structure illustrated in the drawings or described in this specification.

To sum up, in the semiconductor structure proposed by the present disclosure, different gate structures are adopted for the protect gate positioned in the second region and other gates positioned in the first region. In some embodiments, different from the existing solution where a gate structure comprising a gate electrode layer and a high dielectric constant layer is adopted for all gates in all regions, in the present disclosure, a gate structure comprising a gate electrode layer and an oxide insulating layer is adopted for the protect gate in the second region, such that the above two gate structures jointly constitute the entire gate of the semiconductor structure. Through the above design, the present disclosure adopts a gate structure comprising a gate electrode layer and an oxide insulating layer, such that a problem of metal diffusion pollution of an HK layer in the existing solution can be avoided while reducing a connection area of metal on an upper layer, thereby protecting device performance from effect of pollution.

Although description of the present disclosure is made in reference to a plurality of typical embodiments, it shall be understood that terms used herein are exemplary and explanatory only and are not restrictive. The present disclosure can be implemented in various forms without departing from spirit or substance of the present disclosure. Therefore, it shall be understood that the above embodiments are not limited to any foregoing detail, but shall be extensively interpreted within the spirit and scope as defined in the appended claims. Thus, all variations and modifications falling within the claims or equivalent scope thereof shall be covered with the appended claims.

What is claimed is:

1. A semiconductor structure, comprising:
   a substrate, having a first region and a second region;
   a first gate structure positioned in the first region and a second gate structure positioned in the second region, the first gate structure being a high dielectric constant gate comprising a first gate electrode layer and a high dielectric constant layer, and the second gate structure comprising a second gate electrode layer and an oxide insulating layer;
   a spacer and an interlayer dielectric layer, positioned on the first gate structure and the second gate structure, the spacer and the interlayer dielectric layer covering a part of the second gate structure, the substrate, and the first gate structure; and
   a second contact plug, penetrating through the spacer and the interlayer dielectric layer and being in contact with the substrate, the second contact plug being positioned in the second region and being lapped with the second gate structure,
   wherein the oxide insulating layer covers the substrate, the first gate structure is arranged on the oxide insulating layer, a lower surface of the oxide insulating layer below the first gate structure is flush with a lower surface of the oxide insulating layer in the second gate structure.

2. The semiconductor structure according to claim 1, further comprising:
   a first contact plug, penetrating through the spacer and the interlayer dielectric layer and being in contact with the substrate, the first contact plug being spaced apart from the first gate structure.

3. The semiconductor structure according to claim 2, wherein the spacer and the interlayer dielectric layer cover the oxide insulating layer, and the first contact plug and the second contact plug penetrate through the oxide insulating layer, the spacer, and the interlayer dielectric layer.

4. The semiconductor structure according to claim 2, wherein:
the first contact plug comprises a first contact layer in contact with the substrate; and/or
the second contact plug comprises a second contact layer in contact with the substrate.

5. The semiconductor structure according to claim 1, wherein the second gate structure comprises a second gate electrode layer comprising a polysilicon layer, a second barrier layer and a metal layer from bottom to top.

6. The semiconductor structure according to claim 1, wherein the second contact plug is lapped with a first part of top surface of the second gate structure and a first side surface adjacent to the first part of top surface, and a projection of the second contact plug on the substrate is partially overlapped with a projection of the second gate structure on the substrate.

7. The semiconductor structure according to claim 1, wherein the second gate structure further comprises another spacer positioned between the second gate electrode layer and the oxide insulating layer.

8. The semiconductor structure according to claim 1, wherein the first region and the second region are positioned in a peripheral circuit region of the semiconductor structure.

9. A semiconductor structure, comprising:
a substrate, having a first region and a second region;
a first gate structure positioned in the first region and a second gate structure positioned in the second region, the first gate structure being a high dielectric constant gate comprising a first gate electrode layer and a high dielectric constant layer, and the second gate structure comprising a second gate electrode layer and an oxide insulating layer;
a spacer and an interlayer dielectric layer, positioned on the first gate structure and the second gate structure, the spacer and the interlayer dielectric layer covering a part of the second gate structure, the substrate, and the first gate structure; and
a second contact plug, penetrating through the spacer and the interlayer dielectric layer and being in contact with the substrate, the second contact plug being positioned in the second region and being lapped with the second gate structure,
wherein the high dielectric constant layer comprises:
a high dielectric constant insulating layer, arranged on a surface of the substrate; and
a high dielectric constant metal layer, arranged on the high dielectric constant insulating layer;
wherein the first gate electrode layer is arranged on the high dielectric constant metal layer; and
a first dielectric material layer is arranged between the high dielectric constant insulating layer and the high dielectric constant metal layer, and another first dielectric material layer is arranged between the high dielectric constant metal layer and the first gate electrode layer.

10. The semiconductor structure according to claim 9, wherein:
the high dielectric constant metal layer comprises an aluminum oxide metal layer, a second dielectric material layer and a lanthanum oxide metal layer from bottom to top; and/or
the first gate electrode layer comprises a polysilicon layer, a first barrier layer and a metal layer from bottom to top.

11. A method for fabricating a semiconductor structure, comprising:
providing a substrate having a first region and a second region, forming a first gate structure on the first region of the substrate and forming a second gate structure on the second region of the substrate, the first gate structure being a high dielectric constant gate comprising a first gate electrode layer and a high dielectric constant layer, and the second gate structure comprising a second gate electrode layer and an oxide insulating layer, wherein the oxide insulating layer covers the substrate, the first gate structure is arranged on the oxide insulating layer, a lower surface of the oxide insulating layer below the first gate structure is flush with a lower surface of the oxide insulating layer in the second gate structure;
forming a spacer and an interlayer dielectric layer on a surface of the substrate, the spacer and the interlayer dielectric layer covering the substrate, the first gate structure, and the second gate structure;
removing a part of the second gate structure, a part of the spacer and a part of the interlayer dielectric layer to form a second contact hole; and
filling a conductive material into the second contact hole to form a second contact plug partially lapped with the second gate structure.

12. The method for fabricating a semiconductor structure according to claim 11, wherein the forming a first gate structure on the first region of the substrate and forming a second gate structure on the second region of the substrate comprise:
forming a thin-film stacked structure on the substrate, the thin-film stacked structure comprising an oxide insulating layer and a high dielectric constant layer from bottom to top;
forming a first gate material layer on the thin-film stacked structure;
removing a part of the first gate material layer and a part of the thin-film stacked structure by etching to form the first gate structure, and stopping etching upon exposing an upper surface of the oxide insulating layer;
forming a second gate material layer on the oxide insulating layer, the second gate material layer covering the first gate structure; and
removing a part of the second gate material layer by etching, rest of the second gate material layer and the oxide insulating layer jointly constituting the second gate structure.

13. The method for fabricating a semiconductor structure according to claim 12, wherein the removing a part of the first gate material layer and a part of the thin-film stacked structure by etching comprises:
depositing a first photoresist layer on the first gate material layer;
patterning the first photoresist layer;
removing a part of the first gate material layer and a part of the thin-film stacked structure by etching by means of the patterned first photoresist layer to form the first gate structure.

14. The method for fabricating a semiconductor structure according to claim 12, wherein before the forming a second gate material layer on the oxide insulating layer, the method further comprises:

forming a mask layer on a surface of the first gate structure and on a surface of the oxide insulating layer.

15. The method for fabricating a semiconductor structure according to claim 12, wherein the removing a part of the second gate material layer by etching comprises:
   depositing a second photoresist layer on the second gate material layer;
   patterning the second photoresist layer; and
   removing a part of the second gate material layer by etching by means of the patterned second photoresist layer to form the second gate structure.

16. The method for fabricating a semiconductor structure according to claim 11, wherein the forming a first gate structure on the first region of the substrate and forming a second gate structure on the second region of the substrate comprise:
   forming a thin-film stacked structure on the substrate, the thin-film stacked structure comprising an oxide insulating layer and a high dielectric constant layer from bottom to top;
   removing the thin-film stacked structure positioned in the second region by etching, and stopping etching upon exposing an upper surface of the oxide insulating layer;
   forming a first gate material layer covering rest of the thin-film stacked structure, and forming a second gate material layer covering the oxide insulating layer in the second region; and
   removing a part of the first gate material layer and a part of the thin-film stacked structure by etching to form the first gate structure, stopping etching upon exposing the upper surface of the oxide insulating layer, and removing a part of the second gate material layer by etching, rest of the second gate material layer and rest of the oxide insulating layer jointly constituting the second gate structure.

17. The method for fabricating a semiconductor structure according to claim 16, wherein the removing the thin-film stacked structure positioned in the second region by etching comprises:
   depositing a third photoresist layer on the thin-film stacked structure;
   patterning the third photoresist layer; and
   removing the thin-film stacked structure in the second region by etching by means of the patterned third photoresist layer.

18. The method for fabricating a semiconductor structure according to claim 16, wherein the first gate material layer and the second gate material layer have a same material, the removing a part of the first gate material layer and a part of the thin-film stacked structure and removing a part of the second gate material layer by etching comprising:
   depositing a fourth photoresist layer on the first gate material layer and the second gate material layer;
   patterning the fourth photoresist layer; and
   removing a part of the first gate material layer and a part of the thin-film stacked structure and simultaneously removing a part of the second gate material layer by etching by means of the patterned fourth photoresist layer, to form the first gate structure and the second gate structure, respectively.

19. The method for fabricating a semiconductor structure according to claim 11, further comprising:
   forming a first contact hole in the spacer and the interlayer dielectric layer positioned in the first region, the first contact hole being spaced apart from the first gate structure; and
   filling a conductive material into the first contact hole to form a first contact plug in contact with the substrate.

20. The method for fabricating a semiconductor structure according to claim 19, wherein:
   the filling a conductive material into the first contact hole and filling the conductive material into the second contact hole comprise: forming the conductive material covering the interlayer dielectric layer, the conductive material being filled into the first contact hole and the second contact hole; polishing to remove the conductive material covered on an upper surface of the interlayer dielectric layer; and/or
   before the filling a conductive material into the first contact hole and filling the conductive material into the second contact hole, the method further comprises: forming a first contact layer in contact with the substrate at a bottom of the first contact hole, and forming a second contact layer in contact with the substrate at a bottom of the second contact hole.

* * * * *